United States Patent
Silverbrook

(10) Patent No.: US 6,180,427 B1
(45) Date of Patent: Jan. 30, 2001

(54) METHOD OF MANUFACTURE OF A THERMALLY ACTUATED INK JET INCLUDING A TAPERED HEATER ELEMENT

(75) Inventor: Kia Silverbrook, Sydney (AU)

(73) Assignee: Silverbrook Research Pty. Ltd., Balmain NSW (AU)

(*) Notice: Under 35 U.S.C. 154(b), the term of this patent shall be extended for 0 days.

(21) Appl. No.: 09/112,832

(22) Filed: Jul. 10, 1998

(30) Foreign Application Priority Data

Jul. 15, 1997 (AU) .................................................. PO7991
Mar. 25, 1998 (AU) .................................................. PP2591

(51) Int. Cl.⁷ .................................................. H01L 21/00
(52) U.S. Cl. .................................................. 438/21; 347/1; 347/20; 347/47; 347/56; 216/27
(58) Field of Search .................................................. 438/21; 347/1, 347/9, 20, 29, 32, 68, 44, 47, 54, 27, 56, 55; 216/27; 29/25.01; 251/129.01

(56) References Cited

U.S. PATENT DOCUMENTS 5,355,712 * 10/1994 Petersen et al. .................... 73/4 R
5,889,541 * 3/1999 Bobrow et al. ..................... 347/55
5,897,789 * 4/1999 Weber .................................. 216/27

OTHER PUBLICATIONS

Diepold et al.; "A Micromachined Continuous Ink Jet Print Head for High Resolution Printing", Technical Digest MME '97 Southampton, p. 176–179.*
Lee et al.; "A thermal inkjet printhead with a monolithically fabricated nozzle plate and self-aligned ink feed hole"Microelectromechanical Systems, Journal of, Sep. 1999, vol. 8. p. 229–236.*
Wehl, W.R.; "Ink-jet printing the present state of the art", CompEuro '89., 'VLSI and Computer Peripherals. VLSI and Microelectronic Applications in Intelligent Peripherals and their Interconnection Networks', Proc., p.2/46–2/52.*

* cited by examiner

Primary Examiner—John F. Niebling
Assistant Examiner—Christopher Lattin

(57) ABSTRACT

A method of manufacture of an ink jet printing nozzle arrangement on a wafer is disclosed, the arrangement including: an ink chamber having an ink ejection nozzle in one wall thereof for the ejection of ink from the ink chamber; a moveable paddle vane located within the ink chamber, the paddle vane including a concave surface in the area adjacent the ink ejection nozzle; and an actuator means adapted to move the paddle vane so as to cause ink within the ink chamber to be ejected from the ink ejection nozzle; the method comprising the steps of;

(a) starting with a silicon wafer layer having requisite circuitry deposited thereon;

(b) depositing and etching a first sacrificial layer to form a cavity for the paddle vane and a portion of the nozzle chamber;

(c) depositing and etching a series of layers simultaneously forming the operational portions of the actuator means and the paddle vane;

(d) depositing a second sacrificial layer forming a cavity for the ink chamber walls and remaining portions (if any) of the actuator;

(e) depositing the chamber walls and remaining portions of the actuator;

(f) forming a nozzle chamber roof including an ink ejection nozzle;

(g) etching the sacrificial layers away.

Preferably, the step (c) includes utilizing a single mask to etch the layers and step (c) further includes depositing two layers of substantially the same thermal properties, one of the layers including an operational portion of the actuator, such that, upon cooling of the layers, the two layers are in a state of thermal tension between one other.

11 Claims, 15 Drawing Sheets

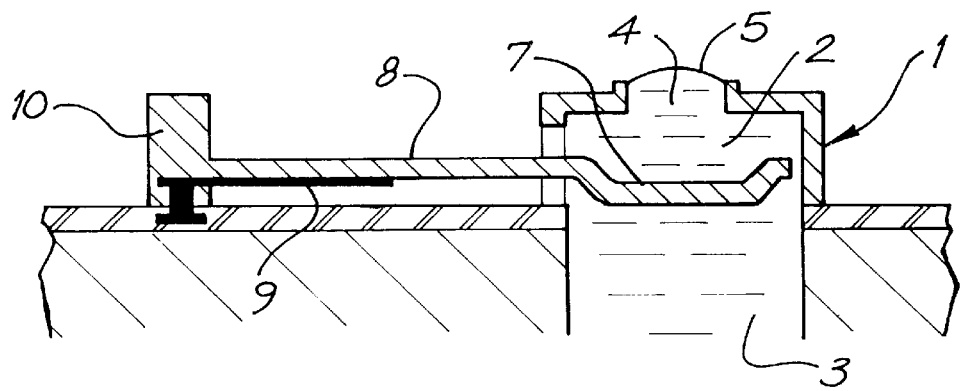
FIG. 1
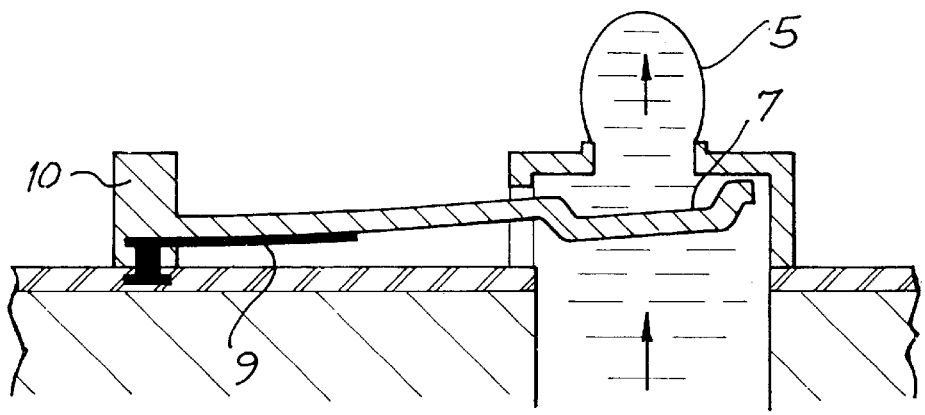
FIG. 2
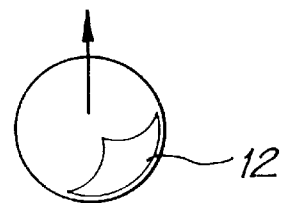
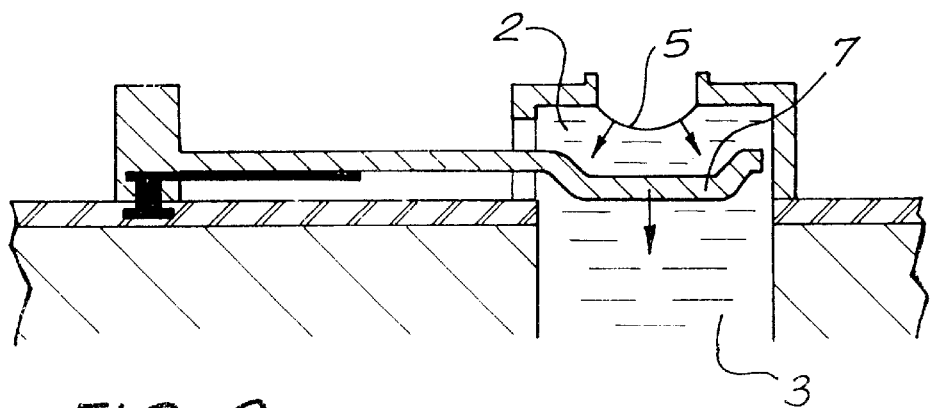
FIG. 3

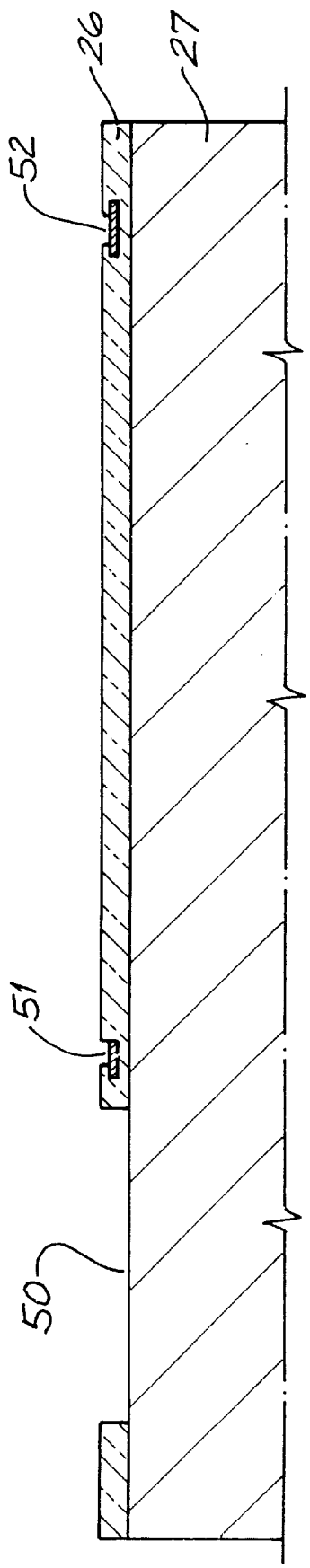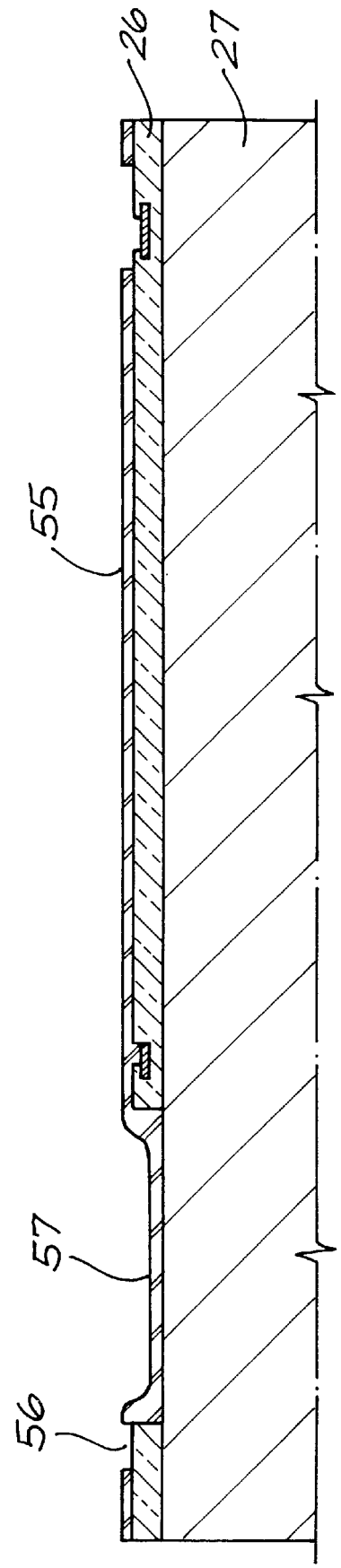

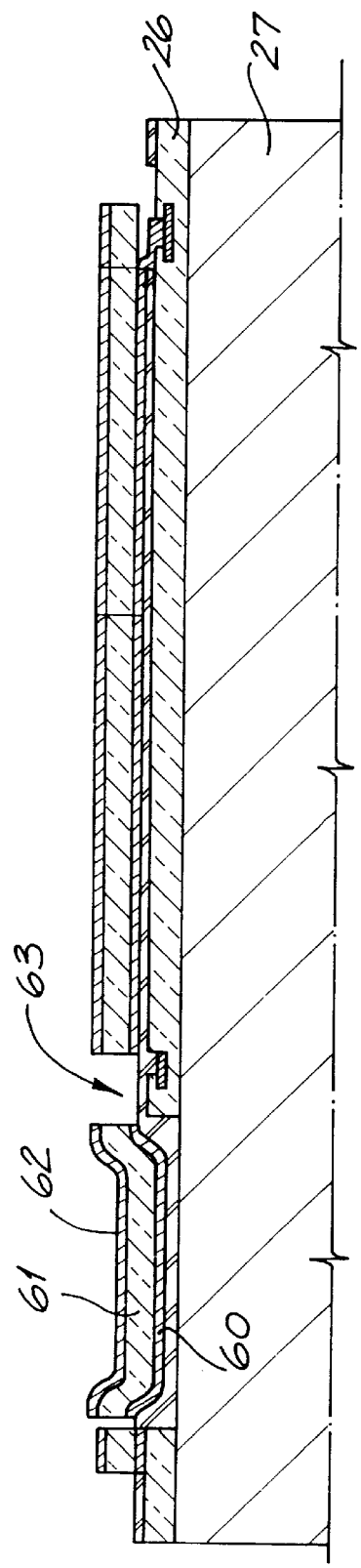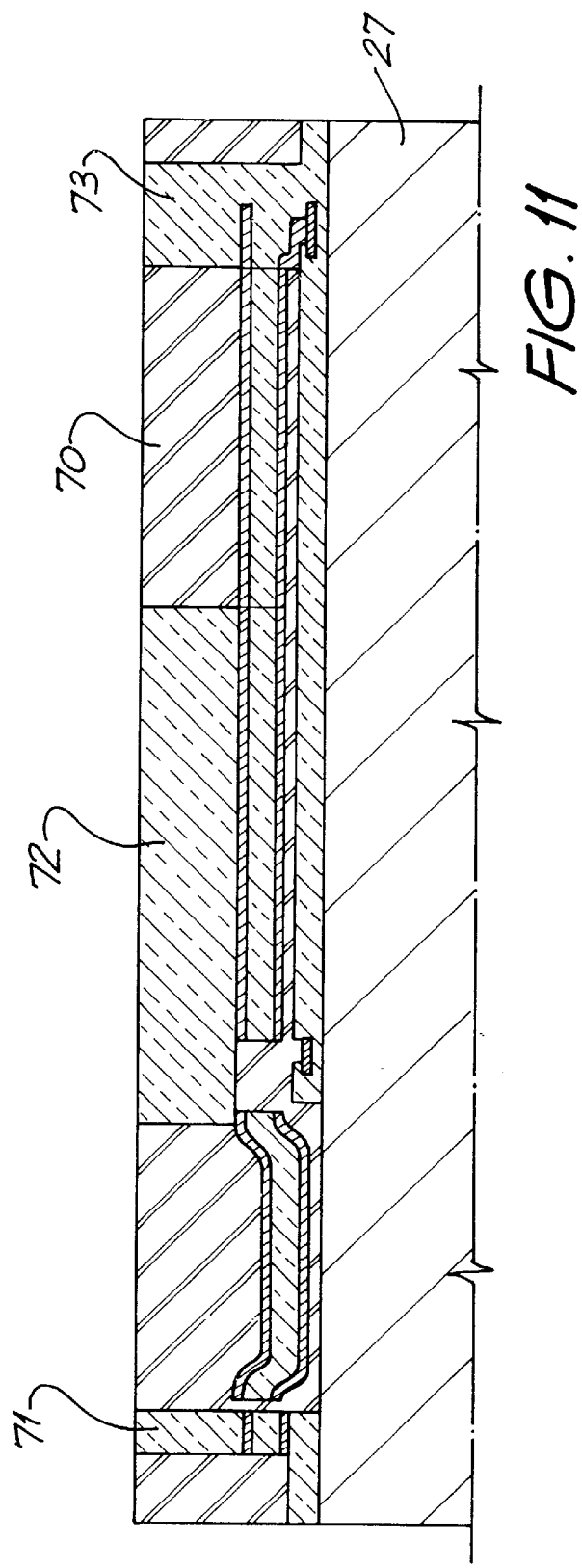

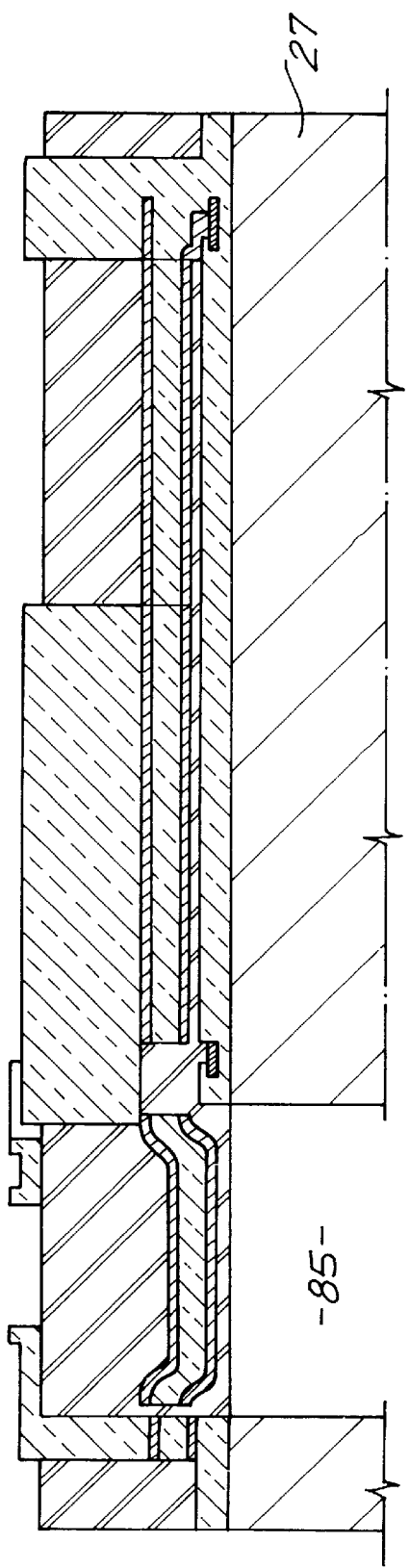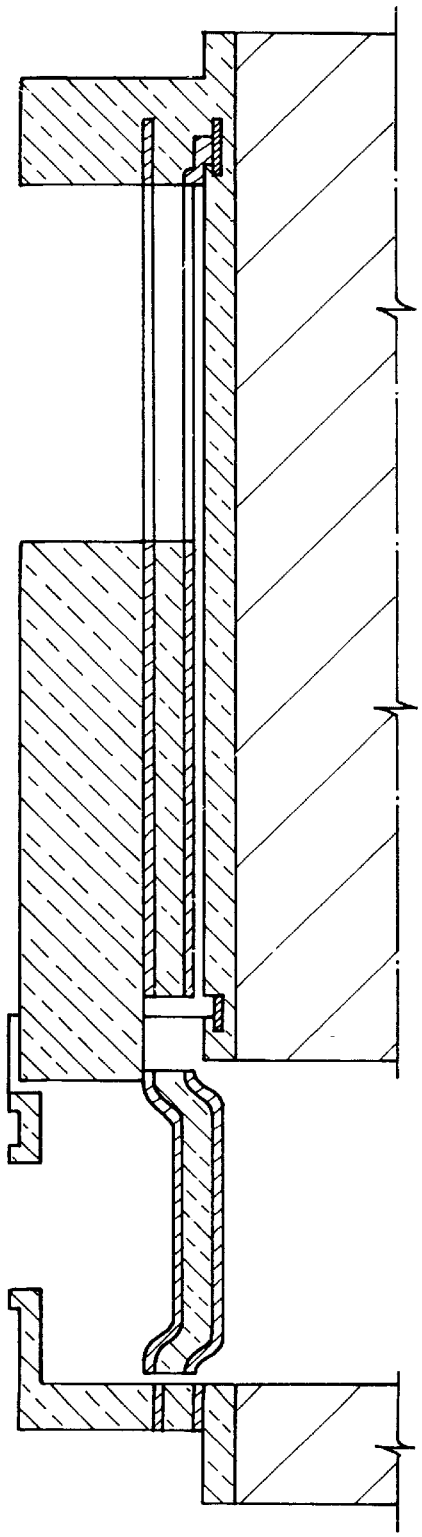

METHOD OF MANUFACTURE OF A THERMALLY ACTUATED INK JET INCLUDING A TAPERED HEATER ELEMENT

CROSS REFERENCES TO RELATED APPLICATIONS

The following co-pending U.S. patent applications, identified by their U.S. patent application serial numbers (USSN), were filed simultaneously to the present application on Jul. 10, 1998, and are hereby incorporated by cross-reference.

| USSN | DOCKET | TITLE |
| --- | --- | --- |
| 09/113,060 | ART01 | Digital Instant Print Camera with Image Processing Capability |
| 09/113,070 | ART02 | Image Transformation Means including User Interface |
| 09/113,073 | ART03 | Digital Camera System with Integral Print Roll |
| 09/112,748 | ART04 | Camera System Including Digital Audio Message Recording on Photographs |
| 09/112,747 | ART06 | Orientation Detection for Digital Cameras |
| 09/112,776 | ART07 | Print Roll Having an Ink Return Tray |
| 09/112,750 | ART08 | Utilising Autofocus Information for Image Processing in a Digital Camera |
| 09/112,746 | ART09 | Utilising Eye Detection Methods for Image Processing in a Digital Image Camera |
| 09/112,743 | ART10 | Utilising Exposure Information for Image Processing in a Digital Camera |
| 09/112,742 | ART11 | Utilising Flash Information for Image Processing in a Digital Camera |
| 09/112,741 | ART12 | Method of Printing on the Back of Output Photo Image in a Digital Instant Camera |
| 09/112,740 | ART13 | De-curling Print Media in a Digital Instant Printing Camera |
| 09/112,739 | ART15 | Psuedo-3D Stereoscopic Images & Output Device |
| 09/113,053 | ART16 | Print Media Roll and Ink Replaceable Cartridge |
| 09/112,738 | ART17 | Psuedo-3D Stereoscopic Print Medium |
| 09/113,067 | ART18 | Preprinted Print Rolls for use in an Image Processing Device |
| 09/113,063 | ART19 | Method and Apparatus for Information Storage in a Portable Print Roll |
| 09/113,069 | ART20 | Authentication System for Camera Print Rolls |
| 09/112,744 | ART21 | Anisotropic Rigidity to Reduce Curl in Rolled Media |
| 09/113,058 | ART22 | Prints Remaining Indicator for Camera with Variable Length Print Capability |
| 09/112,777 | ART24 | Producing Automatic "Painting" Effects in Images |
| 09/113,224 | ART25 | Digital Image Warping System |
| 09/112,804 | ART26 | Digital Image Region Detection Method and Apparatus |
| 09/112,805 | ART27 | Brush Stroke Palette Feedback Method for Automatic Digital "Painting" Effects |
| 09/113,072 | ART28 | Data Distribution Method and Apparatus |
| 09/112,785 | ART29 | Dot Center Tracking in Optical Storage Systems using Ink Dots |
| 09/112,797 | ART30 | Utilising of Brush Stroking Techniques in the Generation of Computer Images |
| 09/112,796 | ART31 | Image Production Utilizing Text Editing Including Complex Character Sets |
| 09/113,071 | ART32 | Camera System with computer Language Interpreter |
| 09/112,824 | ART33 | High Quality Image Copier with Exact Reproduction of Digitally Halftoned Images |
| 09/113,090 | ART34 | A Digital Camera System having Motion Deblurring Means |
| 09/112,823 | ART38 | Miniature Color Printer using Ink and Paper Cartridges |
| 09/113,222 | ART39 | Digital Information Distribution by Means of Printed Cards |
| 09/112,786 | ART42 | Digital Camera System Containing a VLIW Vector Processor |
| 09/113,051 | ART43 | Target Detection for Dot Region Alignment in Optical Storage Systems using Ink Dots |
| 09/112,782 | ART44 | Fault Tolerant Dot Detection in Optical Storage Systems using Ink Dots |
| 09/113,056 | ART45 | Dot Adjacency Compensation in Optical Storage Systems using Ink Dots |
| 09/113,059 | ART46 | Adaptive Tracking of Dots in Optical Storage Systems using Ink Dots |
| 09/113,091 | ART47 | Bump Map Compositing for Simulated Digital Painting Effects |
| 09/112,753 | ART48 | Production of Artistic Effects in Images Utilising Restricted Gamut Spaces |
| 09/113,055 | ART50 | Utilisation of Image Tiling Effects in Photographs |
| 09/113,057 | ART51 | Utilisation of Image Texture Mapping in Photographs |
| 09/113,054 | ART52 | Utilisation of Image Illumination Effects in Photographs |
| 09/112,752 | ART53 | Garment Design and Fabric Printing System Utilizing Digitally Encoded Design Cards |
| 09/112,759 | ART54 | Custom Garment Design and Fabric Printing System |
| 09/112,757 | ART56 | Cascading Image Modification using Multiple Digital Cameras Incorporating Image Processing |
| 09/112,758 | ART57 | Binocular Glasses with an Integral Printer Device |
| 09/113,107 | ART58 | Reader to Decode Sound and Play Sound Encoded on Photographs |
| 09/112,829 | ART59 | Data Addition to Optical Storage Cards using Ink Dots |
| 09/112,792 | ART60 | Vending Machine for the Production of Customised Photos and Artcards |
| 09/112,791 | ART61 | A Re-Writeable Optical Card Reader/Writer Unit using Ink Dots for Data Storage |
| 09/112,790 | ART62 | Artcard for the Control of the Operation of a Camera Device |
| 09/112,789 | ART63 | Artcard for the Administration of the Operation of a Camera Device |
| 09/112,788 | ART64 | Magnetic Recordable Media for Photographic Prints |
| 09/112,795 | ART65 | Digital Photograph Storage using Ink Jet Printing |
| 09/112,749 | ART66 | System for High Volume Printing of Optical Storage Cards Using Ink Dots |
| 09/112,784 | ART68 | Encoded Data Card Reading System |
| 09/112,783 | ART69 | Ink and Media Cartridge with Axial Ink Chambers |
| 09/112,763 | Auth02 | Circuit for Protecting Chips Against IDD Fluctuation Attacks |
| 09/112,762 | Auth03 | Method for Implementing Non-Flashing CMOS |
| 09/112,737 | Auth04 | Method for Protecting On-Chip Memory (flash and RAM) |
| 09/112,761 | Auth05 | Method for Making a Chip Tamper-Resistant |
| 09/113,223 | Auth06 | A system for authenticating physical objects |
| 09/112,781 | DOT01 | Data Distribution Mechanism in the form of Ink Dots on Cards |
| 09/113,052 | DOT02 | Business Card Incorporating Optical Data Storage as Ink Dots |
| 09/112,834 | Fluid01 | Fluid Supply Mechanism |
| 09/113,103 | Fluid02 | Fluid Supply Mechanism |
| 09/113,101 | Fluid03 | Replaceable Pagewidth Ink jet Print Head |
| 09/112,751 | IJ01 | Radiant Plunger Electromagnetic Ink Jet Printing Mechanism |
| 09/112,787 | IJ02 | Electrostatic Ink Jet Printing Mechanism |
| 09/112,802 | IJ03 | Planar Thermoelastic Bend Actuator Ink Jet Printing Mechanism |
| 09/112,803 | IJ04 | Stacked Electrostatic Ink Jet Printing Mechanism |
| 09/113,097 | IJ05 | Reverse Spring Lever Ink Jet Printing Mechanism |
| 09/113,099 | IJ06 | Paddle Type Ink Jet Printing Mechanism |

-continued

| USSN | DOCKET | TITLE |
|---|---|---|
| 09/113,084 | IJ07 | Permanent Magnet Electromagnetic Ink Jet Printing Mechanism |
| 09/113,066 | IJ08 | Planar Swing Grill Electromagnetic Ink Jet Printing Mechanism |
| 09/112,778 | IJ09 | Pump Action Refill Ink Jet Printing Mechanism |
| 09/112,779 | IJ10 | Pulsed Magnetic Field Ink Jet Printing Mechanism |
| 09/113,077 | IJ11 | Two Plate Reverse Firing Electromagnetic Ink Jet Printing Mechanism |
| 09/113,061 | IJ12 | Linear Stepper Actuator Ink Jet Printing Mechanism |
| 09/112,818 | IJ13 | Gear Driven Shutter Ink Jet Printing Mechanism |
| 09/112,816 | IJ14 | Tapered Magnetic Pole Electromagnetic Ink Jet Printing Mechanism |
| 09/112,772 | IJ15 | Linear Spring Electromagnetic Grill Ink Jet Printing Mechanism |
| 09/112,819 | IJ16 | Lorenz Diaphragm Electromagnetic Ink Jet Printing Mechanism |
| 09/112,815 | IJ17 | PTFE Surface Shooting Shuttered Oscillating Pressure Ink Jet Printing Mechanism |
| 09/113,096 | IJ18 | Buckle Grill Oscillating Pressure Ink Jet Printing Mechanism |
| 09/113,068 | IJ19 | Shutter Based Ink Jet Printing Mechanism |
| 09/113,095 | IJ20 | Curling Calyx Thermoelastic Ink Jet Printing Mechanism |
| 09/112,808 | IJ21 | Thermal Actuated Ink Jet Printing Mechanism |
| 09/112,809 | IJ22 | Iris Motion Ink Jet Printing Mechanism |
| 09/112,780 | IJ23 | Direct Firing Thermal Bend Actuator Ink Jet Printing Mechanism |
| 09/113,083 | IJ24 | Conductive PTFE Bend Actuator Vented Ink Jet Printing Mechanism |
| 09/113,121 | IJ25 | Magnetostrictive Ink Jet Printing Mechanism |
| 09/113,122 | IJ26 | Shape Memory Alloy Ink Jet Printing Mechanism |
| 09/112,793 | IJ27 | Buckle Plate Ink Jet Printing Mechanism |
| 09/112,794 | IJ28 | Thermal Elastic Rotary Impeller Ink Jet Printing Mechanism |
| 09/113,128 | IJ29 | Thermoelastic Bend Actuator Ink Jet Printing Mechanism |
| 09/113,127 | IJ30 | Thermoelastic Bend Actuator Using PTFE Corrugated Heater Ink Jet Printing Mechanism |
| 09/112,756 | IJ31 | Bend Actuator Direct Ink Supply Ink Jet Printing Mechanism |
| 09/112,755 | IJ32 | High Young's Modulus Thermoelastic Ink Jet Printing Mechanism |
| 09/112,754 | IJ33 | Thermally Actuated Slotted Chamber Wall Ink Jet Printing Mechanism |
| 09/112,811 | IJ34 | Ink Jet Printer having a Thermal Actuator Comprising an External Coil Spring |
| 09/112,812 | IJ35 | Trough Container Ink Jet Printing Mechanism with Paddle |
| 09/112,813 | IJ36 | Dual Chamber Single Actuator Ink Jet Printing Mechanism |
| 09/112,814 | IJ37 | Dual Nozzle Single Horizontal Fulcrum Actuator Ink Jet Printing Mechanism |
| 09/112,764 | IJ38 | Dual Nozzle Single Horizontal Actuator Ink Jet Printing Mechanism |
| 09/112,765 | IJ39 | Single Bend Actuator Cupped Paddle Ink Jet Printing Mechanism |
| 09/112,767 | IJ40 | Thermally Actuated Ink Jet Printing Mechanism having a Series of Thermal Actuator Units |
| 09/112,768 | IJ41 | Thermally Actuated Ink Jet Printing Mechanism including a Tapered Heater Element |
| 09/112,807 | IJ42 | Radial Back-Curling Thermoelastic Ink Jet Printing Mechanism |
| 09/112,806 | IJ43 | Inverted Radial Back-Curling Thermoelastic Ink Jet Printing Mechanism |
| 09/112,820 | IJ44 | Surface Bend Actuator Vented Ink Supply Ink Jet Printing Mechanism |
| 09/112,821 | IJ45 | A Solenoid Actuated Magnetic Plate Ink Jet Printing Mechanism |

-continued

| USSN | DOCKET | TITLE |
|---|---|---|
| 09/112,822 | IJM01 | Method of Manufacture of a Radiant Plunger Electromagnetic Ink Jet Printer |
| 09/112,825 | IJM02 | Method of Manufacture of an Electrostatic Ink Jet Printer |
| 09/112,826 | IJM03 | Method of Manufacture of a Planar Thermoelastic Bend Actuator Ink Jet Printer |
| 09/112,827 | IJM04 | Method of Manufacture of a Stacked Electrostatic Ink Jet Printer |
| 09/112,828 | IJM05 | A Method of Manufacture of a Reverse Spring Lever Ink Jet Printer |
| 09/113,111 | IJM06 | A Method of Manufacture of a Paddle Type Ink Jet Printer |
| 09/113,108 | IJM07 | Method of Manufacture of a Permanent Magnet Electromagnetic Ink Jet Printer |
| 09/113,109 | IJM08 | Method of Manufacture of a Planar Swing Grill Electromagnetic Ink Jet Printer |
| 09/113,123 | IJM09 | A Method of Manufacture of a Pump Action Refill Ink Jet Printer |
| 09/113,114 | IJM10 | Method of Manufacture of a Pulsed Magnetic Field Ink Jet Printer |
| 09/113,115 | IJM11 | Method of Manufacture of a Two Plate Reverse Firing Electromagnetic Ink Jet Printer |
| 09/113,129 | IJM12 | Method of Manufacture of a Linear Stepper Actuator Ink Jet Printer |
| 09/113,124 | IJM13 | Method of Manufacture of a Gear Driven Shutter Ink Jet Printer |
| 09/113,125 | IJM14 | A Method of Manufacture of a Tapered Magnetic Pole Electromagnetic Ink Jet Printer |
| 09/113,126 | IJM15 | A Method of Manufacture of a Linear Spring Electromagnetic Grill Ink Jet Printer |
| 09/113,119 | IJM16 | Method of Manufacture of a Lorenz Diaphragm Electromagnetic Ink Jet Printer |
| 09/113,120 | IJM17 | A Method of Manufacture of a PTFE Surface Shooting Shuttered Oscillating Pressure Ink Jet Printer |
| 09/113,221 | IJM18 | Method of Manufacture of a Buckle Strip Grill Oscillating Pressure Ink Jet Printer |
| 09/113,116 | IJM19 | Method of Manufacture of a Shutter Based Ink Jet Printer |
| 09/113,118 | IJM20 | Method of Manufacture of a Curling Calyx Thermoelastic Ink Jet Printer |
| 09/113,117 | IJM21 | A Method of Manufacture of a Thermal Actuated Ink Jet Printer |
| 09/113,113 | IJM22 | Method of Manufacture of an Iris Motion Ink Jet Printer |
| 09/113,130 | IJM23 | A Method of Manufacturing of a Direct Firing Thermal Bend Actuator Ink Jet Printer |
| 09/113,110 | IJM24 | Method of Manufacture of a Conductive PTFE Bend Actuator Vented Ink Jet Printer |
| 09/113,112 | IJM25 | A Method of Manufacture of a Magnetostrictive Ink Jet Printer |
| 09/113,087 | IJM26 | Method of Manufacture of a Shape Memory Alloy Ink Jet Printer |
| 09/113,074 | IJM27 | Method of Manufacture of Buckle Plate Ink Jet Printer |
| 09/113,089 | IJM28 | Method of Manufacture of a Thermal Elastic Rotary Impeller Ink Jet Printer |
| 09/113,088 | IJM29 | Method of Manufacture of a Thermoelastic Bend Actuator Ink Jet Printer |
| 09/112,771 | IJM30 | Method of Manufacture of a Thermoelastic Bend Actuator Using PTFE and Corrugated Copper Ink Jet Printer |
| 09/112,769 | IJM31 | Method of Manufacture of a Bend Actuator Direct Ink Supply Ink Jet Printer |
| 09/112,770 | IJM32 | Method of Manufacture of a High Young's Modulus Thermoelastic Ink Jet Printer |
| 09/112,817 | IJM33 | Method of Manufacture of a Thermally Actuated Slotted Chamber Wall Ink Jet Printer |
| 09/113,076 | IJM34 | Method of Manufacture of an Ink Jet Printer Having a Thermal Actuator Comprising an External Coil Spring |
| 09/112,798 | IJM35 | Method of Manufacture of an Image Creation Apparatus |
| 09/112,801 | IJM36 | A Method of Manufacture of a Dual Chamber Single Vertical Actuator Ink Jet Printer |

-continued

| USSN | DOCKET | TITLE |
| --- | --- | --- |
| 09/112,800 | IJM37 | Dual Nozzle Single Horizontal Fulcrum Actuator Ink Jet |
| 09/112,799 | IJM38 | Method of Manufacture of a Dual Nozzle Single Horizontal Actuator Ink Jet Printer |
| 09/113,098 | IJM39 | Single Bend Actuator Cupped Paddle Ink Jet Printing Device |
| 09/112,833 | IJM40 | Method of Manufacture of a Thermally Actuated Ink Jet Printer having a Series of Thermal Actuator Units |
| 09/112,832 | IJM41 | A Method of Manufacture of a Thermally Actuated Ink Jet including a Tapered Heater Element |
| 09/112,831 | IJM42 | Method of Manufacture of a Radial Back-Curling Thermoelastic Ink Jet Printer |
| 09/112,830 | IJM43 | Method of Manufacture of an Inverted Radial Back-Curling Thermoelastic Ink Jet |
| 09/112,836 | IJM44 | Method of Manufacture of a Surface Bend Actuator Vented Ink Supply Ink Jet Printer |
| 09/112,835 | IJM45 | Method of Manufacture of a Solenoid Actuated Magnetic Plate Ink Jet Printer |
| 09/113,102 | IR01 | A Low Cost Disposable Digital Instant Printing Camera System |
| 09/113,106 | IR02 | A Compact Form Storage of Replenishable Portions of a Print On Demand Camera System |
| 09/113,105 | IR04 | Print Head Ink Supply System |
| 09/113,104 | IR05 | Integrated Camera Circuit including Image Sensor, Image Processing, and Printer Drive Circuits |
| 09/112,810 | IR06 | Reusable Camera System which Authenticates a Refill Station |
| 09/112,766 | IR10 | Recycling of Multi-Use Digital Instant Printing Camera Systems |
| 09/113,085 | IR12 | Camera Picture Printing User Interface and Method |
| 09/113,086 | IR13 | Method Integrating the Electronic Components of a Digital Printing Camera System |
| 09/113,094 | IR14 | Method of Color Correction in a Digital Camera System |
| 09/112,760 | IR16 | A Power Drive System for a Print on Demand Digital Camera System |
| 09/112,773 | IR17 | Paper Guide System in a Print on Demand Digital Camera System |
| 09/112,774 | IR18 | Guillotine System in a Print on Demand Digital Camera System |
| 09/112,775 | IR19 | Ink jet Print Head Recapping Mechanism |
| 09/112,745 | IR20 | Apparatus for Automated Photo Counting in a Print on Demand Digital Camera System |
| 09/113,092 | IR21 | On Chip Clocking System for a Camera Device |
| 09/113,100 | MEMS02 | Corrugated MEMS Heater Structure |
| 09/113,093 | MEMS03 | Utilising Venting in a MEMS Liquid Pumping System |
| 09/113,062 | MEMS04 | Clamping of Layers in a Multi-Layer MEMS Actuator |
| 09/113,064 | MEMS05 | Utilisation of Quantum Wires in MEMS Actuators |
| 09/113,082 | MEMS06 | Grill Structure for Filtering Fluids |
| 09/113,081 | MEMS07 | Thermal Actuator |
| 09/113,080 | MEMS09 | Utilisation of Air Bubbles in a MEMS Pumping System |
| 09/113,079 | MEMS10 | Micro Cilia Array and Use Thereof |
| 09/113,065 | MEMS11 | Utilisation of Barrier Layers in the Construction of a Micro Electro Mechanical System |
| 09/113,078 | MEMS12 | Lever Arrangement for a Micro-Electro Mechanical System |
| 09/113,075 | MEMS13 | Method of TAB Alignment in an Integrated Circuit Type Device |

STATEMENT REGARDING FEDERALLY SPONSORED RESEARCH OR DEVELOPMENT

Not applicable.

FIELD OF THE INVENTION

The present invention relates to the field of inkjet printers and discloses an inkjet printing system which includes a bend actuator interconnected into a paddle for the ejection of ink through an ink ejection nozzle. In particular, the present invention includes a Method of Manufacture of a Thermally Actuated Ink Jet Including a Tapered Heater Element.

BACKGROUND OF THE INVENTION

Many different types of printing have been invented, a large number of which are presently in use. The known forms of printers have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques on ink jet printing have been invented. For a survey of the field, reference is made to an article by J Moore, "Non-Impact Printing: Introduction and Historical Perspective", Output Hard Copy Devices, Editors R Dubeck and S Sherr, pages 207–220 (1988).

Ink Jet printers themselves come in many different types. The utilisation of a continuous stream ink in ink jet printing appears to date back to at least 1929 wherein U.S. Pat. No. 1,941,001 by Hansell discloses a simple form of continuous stream electrostatic ink jet printing.

U.S. Pat. No. 3,596,275 by Sweet also discloses a process of a continuous ink jet printing including the step wherein the ink jet stream is modulated by a high frequency electrostatic field so as to cause drop separation. This technique is still utilized by several manufacturers including Elmjet and Scitex (see also U.S. Pat. No. 3,373,437 by Sweet et al)

Piezoelectric ink jet printers are also one form of commonly utilized ink jet printing device. Piezoelectric systems are disclosed by Kyser et al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a sheer mode type of piezoelectric transducer element.

Recently, thermal ink jet printing has become an extremely popular form of ink jet printing. The ink jet printing techniques include those disclosed by Endo et al in GB 2007162 (1979) and Vaught et al in U.S. Pat. No. 4,4907,28. Both the aforementioned references disclosed ink jet printing techniques rely upon the activation of an electrothermal actuator which results in the creation of a bubble in a constricted space, such as a nozzle, which thereby causes the ejection of ink from an aperture connected to the confined space onto a relevant print media. Printing devices utilizing the electro-thermal actuator are manufactured by manufacturers such as Canon and Hewlett Packard.

As can be seen from the foregoing, many different types of printing technologies are available. Ideally, a printing technology should have a number of desirable attributes. These include inexpensive construction and operation, high speed operation, safe and continuous long term operation etc. Each technology may have its own advantages and disadvantages in the areas of cost, speed, quality, reliability, power usage, simplicity of construction operation, durability and consumables.

In the construction of any inkjet printing system, there are a considerable number of important factors which must be traded off against one another especially as large scale printheads are constructed, especially those of a pagewidth type. A number of these factors are outlined in the following paragraphs.

Firstly, inkjet printheads are normally constructed utilising micro-electromechanical systems (MEMS) techniques. As such, they tend to rely upon the standard integrated circuit construction/fabrication techniques of depositing planar layers on a silicon wafer and etching certain portions of the planar layers. Within silicon circuit fabrication technology, certain techniques are more well known and others. For example, the techniques associated with the creation of CMOS circuits are likely to be more readily used than those associated with the creation of exotic circuits including ferroelectrics, gallium arsenide etc. Hence, it is desirable, in any MEMS constructions, to utilise well proven semi-conductor fabrication techniques which do not require the utilisation of any "exotic" processes or materials. Of course, a certain degree of trade off will be undertaken in that if the use of the exotic material far out weighs its disadvantages then it may become desirable to utilise the material anyway.

With a large array of ink ejection nozzles, it is desirable to provide for a highly automated form of manufacturing which results in an inexpensive production of multiple printhead devices.

Preferably, the device constructed utilises a low amount of energy in the ejection of ink. The utilisation of a low amount of energy is particularly important when a large pagewidth full color printhead is constructed having a large array of individual print ejection mechanisms with each ejection mechanism, in the worst case, being fired in a rapid sequence.

Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

It is an object of the present invention to provide for a method of manufacture of an ink ejection nozzle arrangement suitable for incorporation into an inkjet printhead arrangement for the ejection of ink on demand from a nozzle chamber in an efficient manner.

In accordance with a first aspect of the present invention, there is provided a method of manufacture of an ink jet printing nozzle arrangement on a wafer, the arrangement including: an ink chamber having an ink ejection nozzle in one wall thereof for the ejection of ink from the ink chamber; a moveable paddle vane located within the ink chamber, the paddle vane including a concave surface in the area adjacent the ink ejection nozzle; and an actuator means adapted to move the paddle vane so as to cause ink within the ink chamber to be ejected from the ink ejection nozzle; the method comprising the steps of:

(a) starting with a silicon wafer layer having requisite circuitry deposited thereon;

(b) depositing and etching a first sacrificial layer to form a cavity for the paddle vane and a portion of the nozzle chamber;

(c) depositing and etching a series of layers simultaneously forming the operational portions of the actuator means and the paddle vane;

(d) depositing a second sacrificial layer forming a cavity for the ink chamber walls and remaining portions (if any) of the actuator;

(e) depositing the chamber walls and remaining portions of the actuator;

(f) forming a nozzle chamber roof including an ink ejection nozzle;

(g) etching the sacrificial layers away.

Preferably, the step (c) includes utilizing a single mask to etch the layers and step (c) further includes depositing two layers of substantially the same thermal properties, one of the layers including an operational portion of the actuator, such that, upon cooling of the layers, the two layers are in a state of thermal tension between one other.

BRIEF DESCRIPTION OF THE DRAWINGS

Notwithstanding any other forms which may fall within the scope of the present invention, preferred forms of the invention will now be described, by way of example only, with reference to the accompanying drawings in which:

FIGS. 1–3 illustrate the operational principles of the preferred embodiment,

FIGS. 8–15 illustrate the manufacturing steps in the construction of the preferred embodiment;

DESCRIPTION OF PREFERRED AND OTHER EMBODIMENTS

Figure 4:
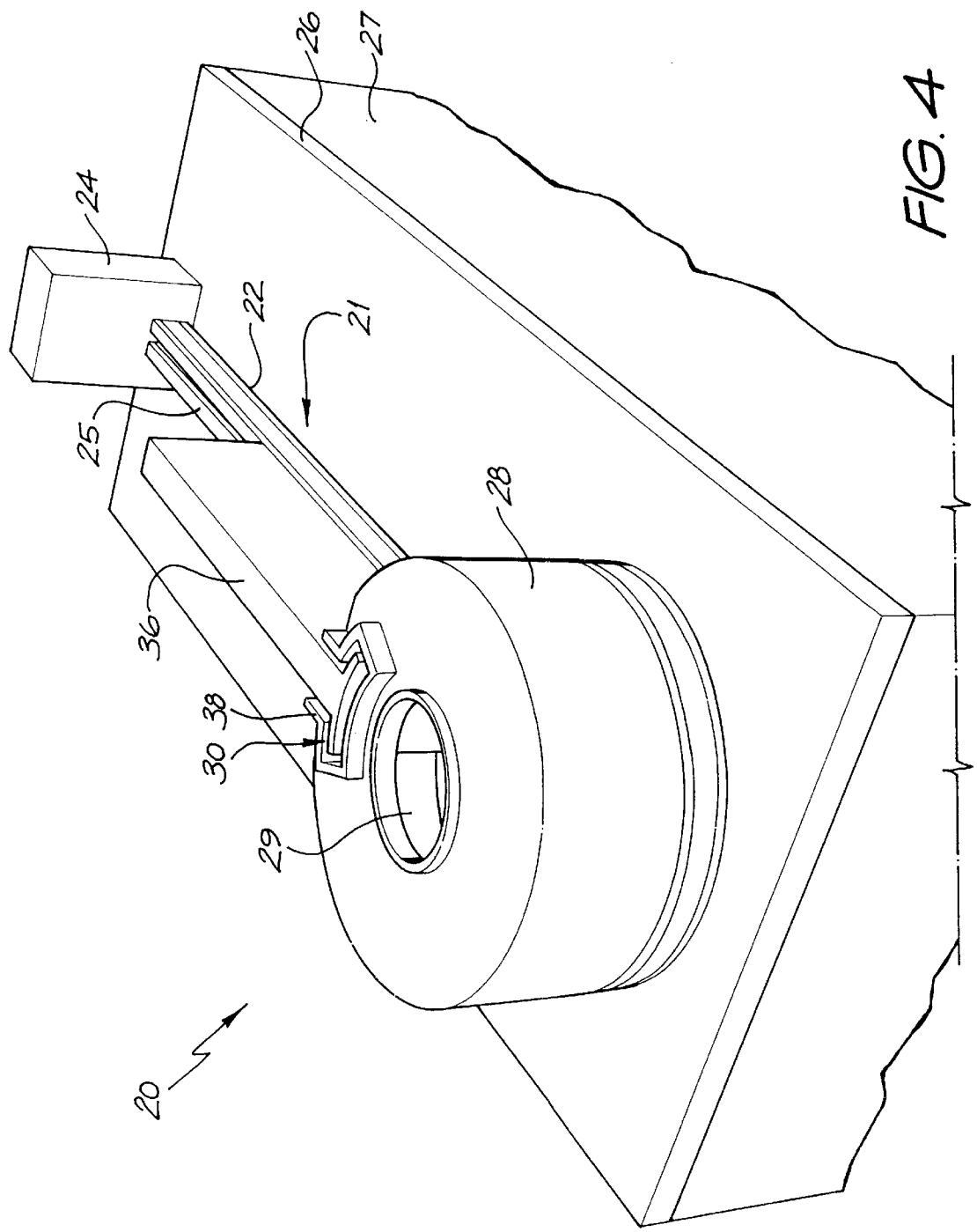
FIG. 4 is a side perspective view of a single nozzle arrangement of the preferred embodiment.

In the preferred embodiment, there is provided a nozzle chamber having ink within it and a thermal actuator device interconnected to a panel the thermal actuator device being actuated so as to eject ink from the nozzle chamber. The preferred embodiment includes a particular thermal actuator structure which includes a tapered heater structure arm for providing positional heating of a conductive heater layer row. The actuator arm is interconnected to a paddle by a slotted wall in the nozzle chamber. The actuator arm has a mating shape so as to mate substantially with the surfaces of the slot in the nozzle chamber wall.

Turning initially to FIG. 1–3, there is provided schematic illustrations of the basic operation of the device. A nozzle chamber 1 is provided filled with ink 2 by means of an ink inlet channel 3 which can be etched through a wafer substrate on which the nozzle chamber 1 rests. The nozzle chamber 1 includes an ink ejection aperture 4 around which an ink meniscus forms.

Inside the nozzle chamber 1 is a paddle type device 7 which is interconnected to an actuator arm 8 through a slot in the wall of the nozzle chamber 1. The actuator arm 8 includes a heater means eg. 9 located adjacent to a post end portion 10 of the actuator arm. The post 10 is fixed to a substrate.

When it is desired to eject a drop from the nozzle chamber, as illustrated in FIG. 2, the heater means 9 is heated so as to undergo thermal expansion. Preferably, the heater means itself or the other portions of the actuator arm 8 are built from materials having a high bend efficiency where the bend efficiency is defined as $$\text{bend efficiency} = \frac{\text{Young's Modulus} \times (\text{Coefficient of thermal Expansion})}{\text{Density} \times \text{Specific Heat Capacity}}$$

A suitable material for the heater elements is a copper nickel alloy which can be formed so as to bend a glass material.

The heater means is ideally located adjacent the post end portion 10 such that the effects of activation are magnified at the paddle end 7 such that small thermal expansions near post 10 result in large movements of the paddle end. The heating 9 causes a general increase in pressure around the ink meniscus 5 which expands, as illustrated in FIG. 2, in a rapid manner. The heater current is pulsed and ink is ejected out of the nozzle 4 in addition to flowing in from the ink channel 3. Subsequently, the paddle 7 is deactivated to again return to its quiescent position. The deactivation causes a general reflow of the ink into the nozzle chamber. The forward momentum of the ink outside the nozzle rim and the corresponding backflow results in a general necking and breaking off of the drop 12 which proceeds to the print media. The collapsed meniscus 5 results in a general sucking of ink into the nozzle chamber 2 via the in flow channel 3. In time, the nozzle chamber is refilled such that the position in FIG. 1 is again reached and the nozzle chamber is subsequently ready for the ejection of another drop of ink.

Turning now to FIG. 4, there is illustrated a single nozzle arrangement 20 of the preferred embodiment. The arrangement includes an actuator arm 21 which includes a bottom arm 22 which is constructed from a conductive material such as a copper nickel alloy (hereinafter called cupronickel) or titanium nitride (TiN). The layer 22, as will become more apparent hereinafter includes a tapered end portion near the end post 24. The tapering of the layer 22 near this end means that any conductive resistive heating occurs near the post portion 24.

The layer 22 is connected to the lower CMOS layers 26 which are formed in the standard manner on a silicon substrate surface 27. The actuator arm 21 is interconnected to an ejection paddle which is located within a nozzle chamber 28. The nozzle chamber includes an ink ejection nozzle 29 from which ink is ejected and includes a convoluted slot arrangement 30 which is constructed such that the actuator arm 21 is able to move up and down whilst causing minimal pressure fluctuations in the area of the nozzle chamber 28 around the slotted interconnect 30.

Figure 5:
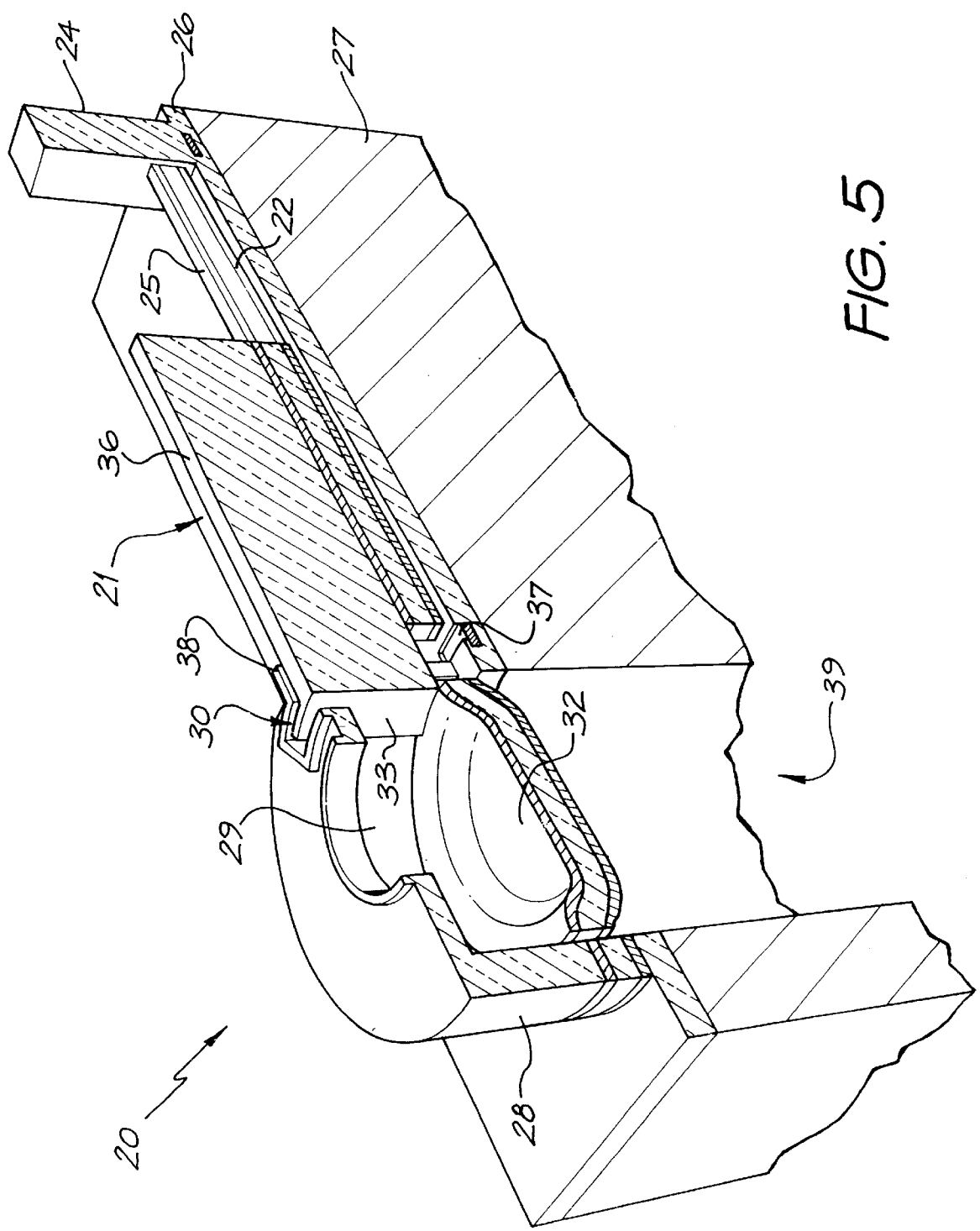
FIG. 5 illustrates a side sectional view of a single nozzle arrangement.

FIG. 5 illustrates a sectional view through a single nozzle. FIG. 5 illustrates more clearly the internal structure of the nozzle chamber which includes the paddle 32 attached to the actuator arm 21 by means of arm 33. Importantly, the actuator arm 21 includes, as noted previously, a bottom conductive strip portion 22. Additionally, a second top strip portion 25 is also provided.

Figure 6:
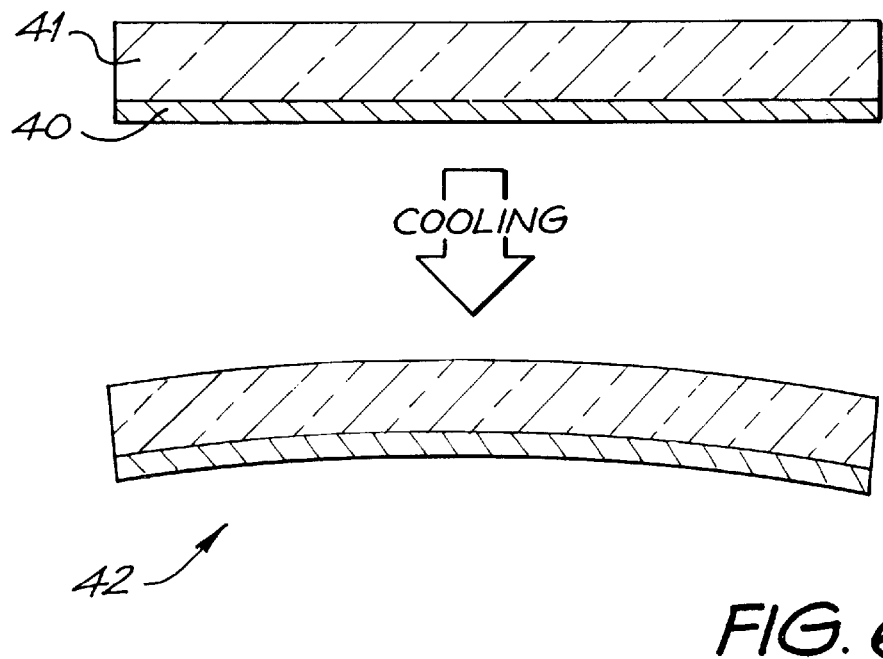
FIGS. 6 and 7 illustrate operational principles of the preferred embodiment.

The utilization of a second layer 25 of the same material as the first layer 22 allows for more accurate control of the actuator position as will be described with reference to FIGS. 6 and 7. In FIG. 6, there is illustrated the example where a high Young's Modulus material 40 is deposited utilizing standard semiconductor deposition techniques and on top of which is further deposited a second layer 41 having a much lower Young's Modulus. Unfortunately, the deposition is likely to occur at a high temperature. Upon cooling, the two layers are likely to have different coefficients of thermal expansion and different Young's Modulus. Hence, in ambient room temperature, the thermal stresses are likely to cause bending of the two layers of material as shown 42.

Figure 7:
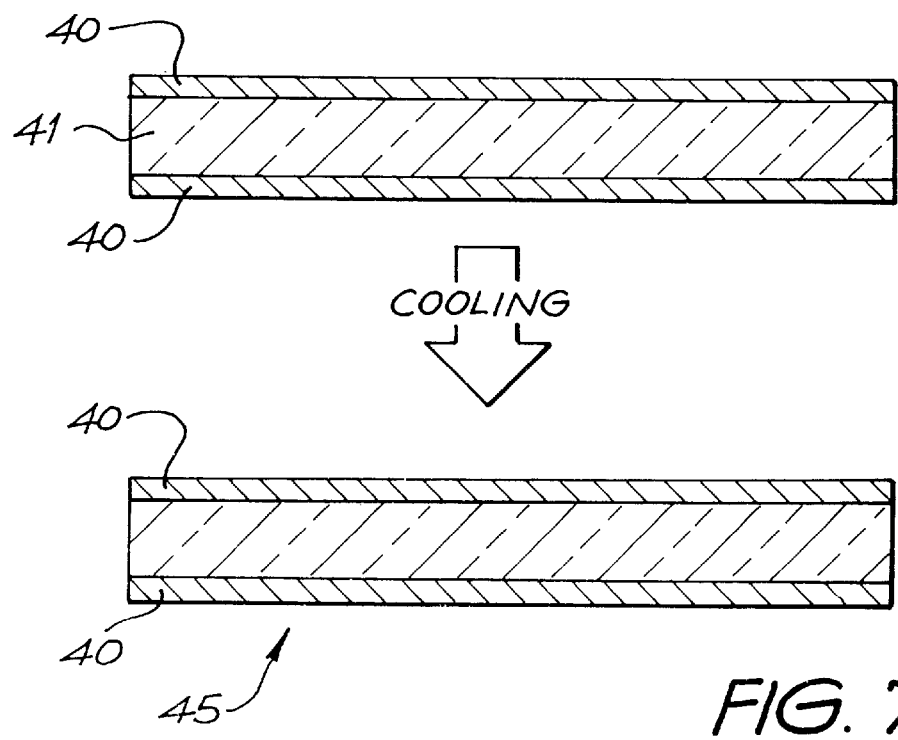

By utilizing a second deposition of the material having a high Young's Modulus, the situation in FIG. 7 is likely to result wherein the material 41 is sandwiched between the two layers 40. Upon cooling, the two layers 40 are kept in tension with one another so as to result in a more planar structure 45 regardless of the operating temperature. This principle is utilized in the deposition of the two layers 22, 25 of FIGS. 4–5.

Turning again to FIGS. 4 and 5, one important attribute of the preferred embodiments includes the slotted arrangement 30. The slotted arrangement results in the actuator arm 21 moving up and down thereby causing the paddle 32 to also move up and down resulting in the ejection of ink. The slotted arrangement 30 results in minimum ink outflow through the actuator arm interconnection and also results in minimal pressure increases in this area. The base 33 of the actuator arm is extended out so as to form an extended interconnect with the paddle surface thereby providing for better attachment. The face 33 is connected to a block arm 36 which is provided to provide a high degree of rigidity. The actuator arm 36 and the wall of the nozzle chamber 28 have a general corrugated nature so as to reduce any flow of ink through the interconnection. The exterior surface of the nozzle chamber adjacent the block portion 36 has a rim eg. 38 so to minimize wicking of ink outside of the nozzle chamber. A pit 37 is also provided for this purpose. The pit 37 is formed in the lower CMOS layers 26. An ink supply channel 39 is provided by means of back etching through the wafer to the back surface of the nozzle.

Turning now to FIGS. 8–15 there will now be described the manufacturing steps utilizing the construction of a single nozzle in accordance with the preferred embodiment.

The manufacturing uses standard micro-electro mechanical techniques. For a general introduction to a micro-electro mechanical system (MEMS) reference is made to standard proceedings in this field including the proceeding of the SPIE (International Society for Optical Engineering) including volumes 2642 and 2882 which contain the proceedings of recent advances and conferences in this field.

Figure 12:
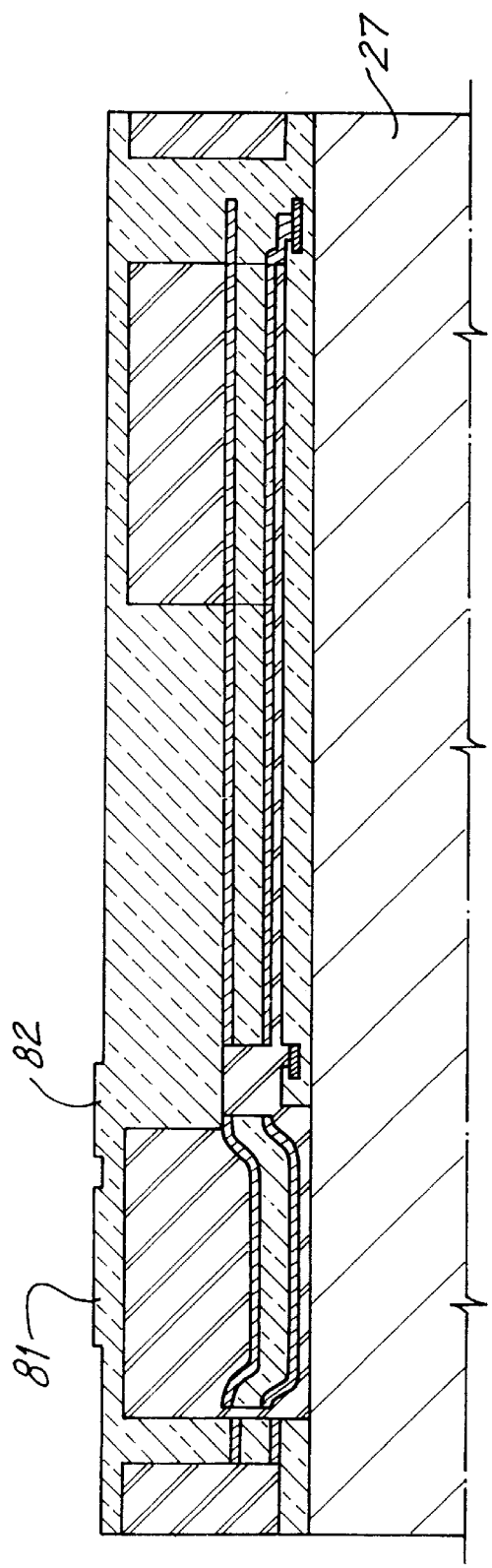
Figure 13:
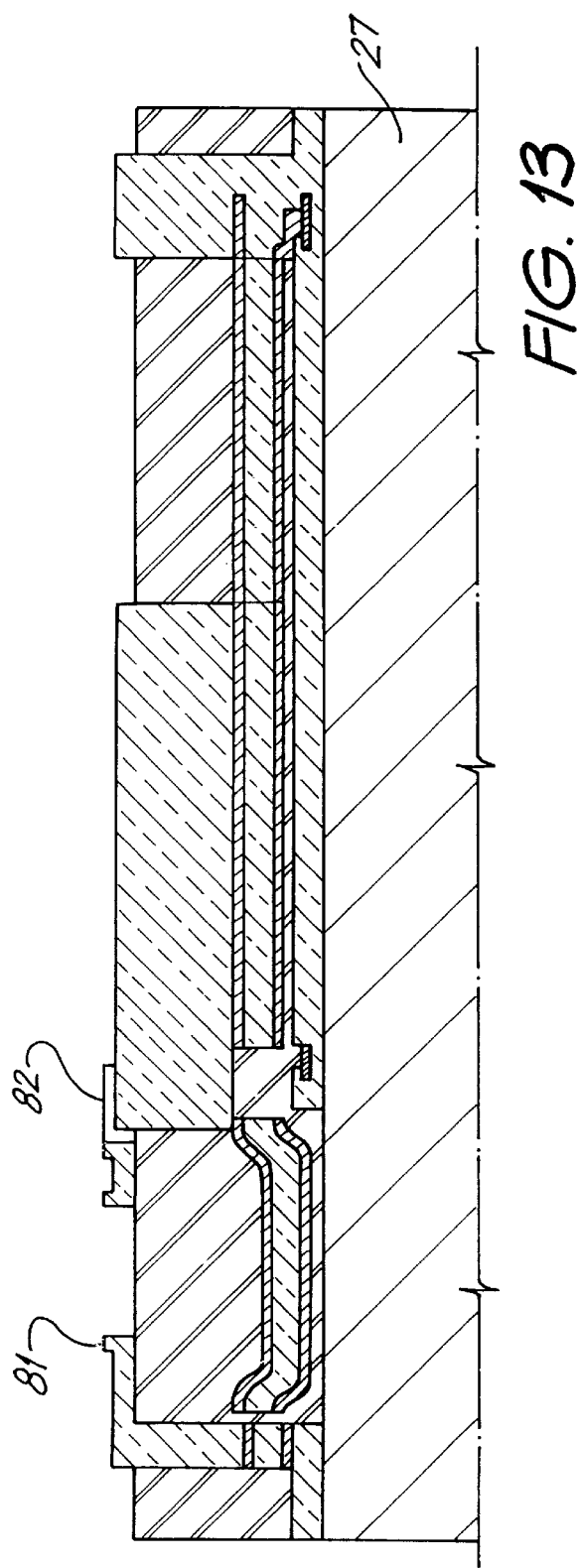

1. The preferred embodiment starts with a double sided polished wafer complete with, say, a 0.2 μm 1 poly 2 metal CMOS process providing for all the electrical interconnects necessary to drive the inkjet nozzle.
2. As shown in FIG. 8, the CMOS wafer is etched 50 down to the silicon layer 27. The etching includes etching down to an aluminum CMOS layer 51, 52.
3. Next, as illustrated in FIG. 9, a 1 μm layer of sacrificial material 55 is deposited. The sacrificial material can be aluminum or photosensitive polyimide.
4. The sacrificial material is etched in the case of aluminum or exposed and developed in the case of polyimide in the area of the nozzle rim 56 and including a depressed paddle area 57.
5. Next, a 1 μm layer of heater material (cupronickel or TiN) is deposited 60.
6. A 3.4 μm layer of PECVD glass 61 is then deposited.
7. A second layer 62 equivalent to the first layer 60 is then deposited.
8. All three layers 60–62 are then etched utilizing the same mask. The utilization of a single mask substantially reduces the complexity in the processing steps involved in creation of the actuator paddle structure and the resulting structure is as illustrated in FIG. 10. Importantly, a break 63 is provided so as to ensure electrical isolation of the heater portion from the paddle portion.
9. Next, as illustrated in FIG. 11, a 10 μm layer of sacrificial material 70 is deposited.
10. The deposited layer is etched (or just developed if polyimide) utilizing a fourth mask which includes nozzle rim etchant holes 71 block portion holes 72 and post portion 73.
11. Next a 10 μm of PCVD glass is deposited so as to form the nozzle rim 71, arm portions 72 and post portions 73.
12. The glass layer is then planarized utilizing chemical mechanical planarization (CMP) with the resulting structure as illustrated in FIG. 11.
13. Next, as illustrated in FIG. 11, a 3 μm layer of PECVD glass is deposited.
14. The deposited glass is then etched as shown in FIG. 12, to a depth of approximately 1 μm so as to form nozzle rim portion 81 and actuator interconnect portion 82.
15. Next, as illustrated in FIG. 13, the glass layer is etched utilizing a 6th mask so as to form final nozzle rim portion 81 and actuator guide portion 82.
16. Next, as illustrated in FIG. 14, the ink supply channel is back etched 85 from the back of the wafer utilizing a 7th mask. The etch can be performed utilizing a high precision deep silicon trench etcher such as the STS Advanced Silicon Etcher (ASE). This step can also be utilized to nearly completely dice the wafer.
17. Next, as illustrated in FIG. 15 the sacrificial material can be stripped or dissolved to also complete dicing of the wafer in accordance with requirements.
18. Next, the printheads can be individually mounted on attached molded plastic ink channels to supply ink to the ink supply channels.
19. The electrical control circuitry and power supply can then be bonded to an etch of the printhead with a TAB film.
20. Generally, if necessary, the surface of the printhead is then hydrophobized so as to ensure minimal wicking of the ink along external surfaces. Subsequent testing can determine operational characteristics.

Figure 16:
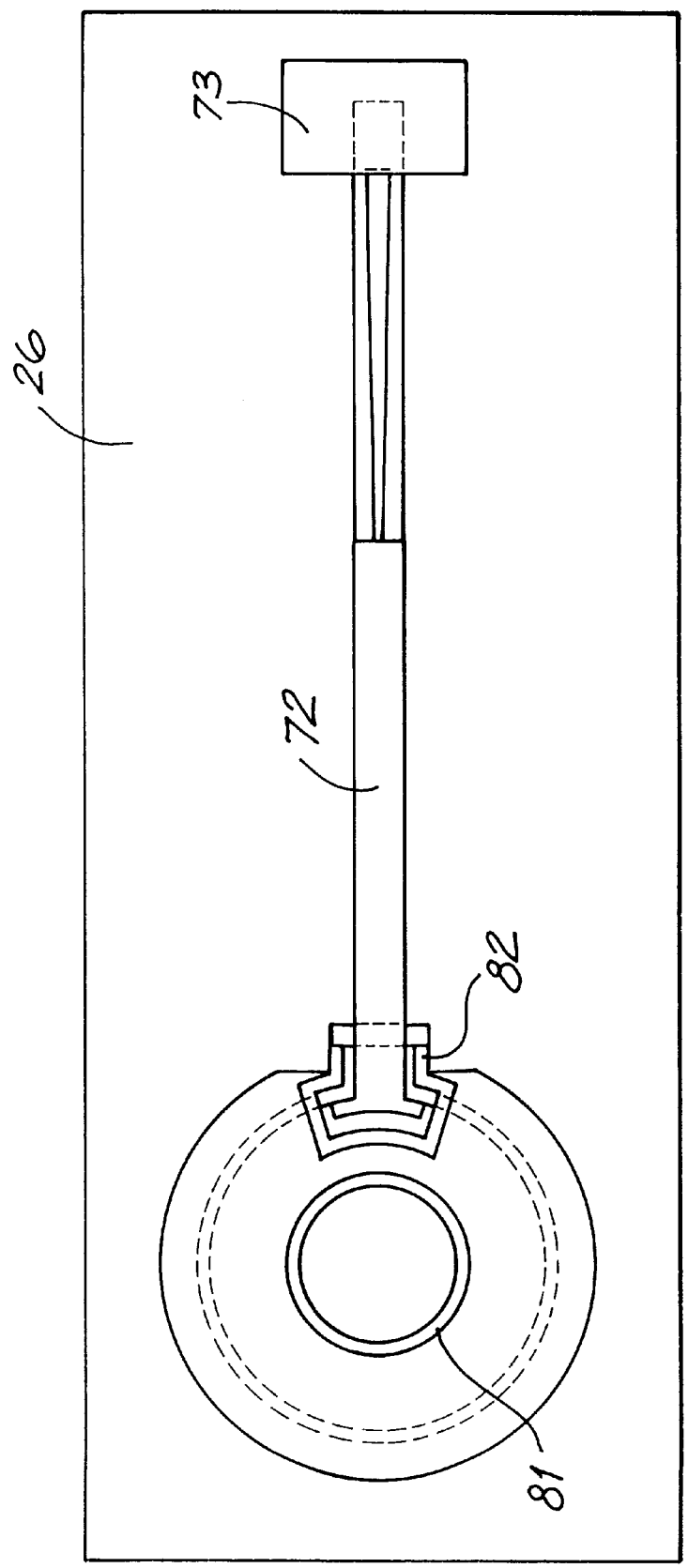
FIG. 16 illustrates a top plan view of a single nozzle.

Importantly, as shown in the plan view of FIG. 16, the heater element has a tapered portion adjacent the post 73 so as to ensure maximum heating occurs near the post.

Figure 17:
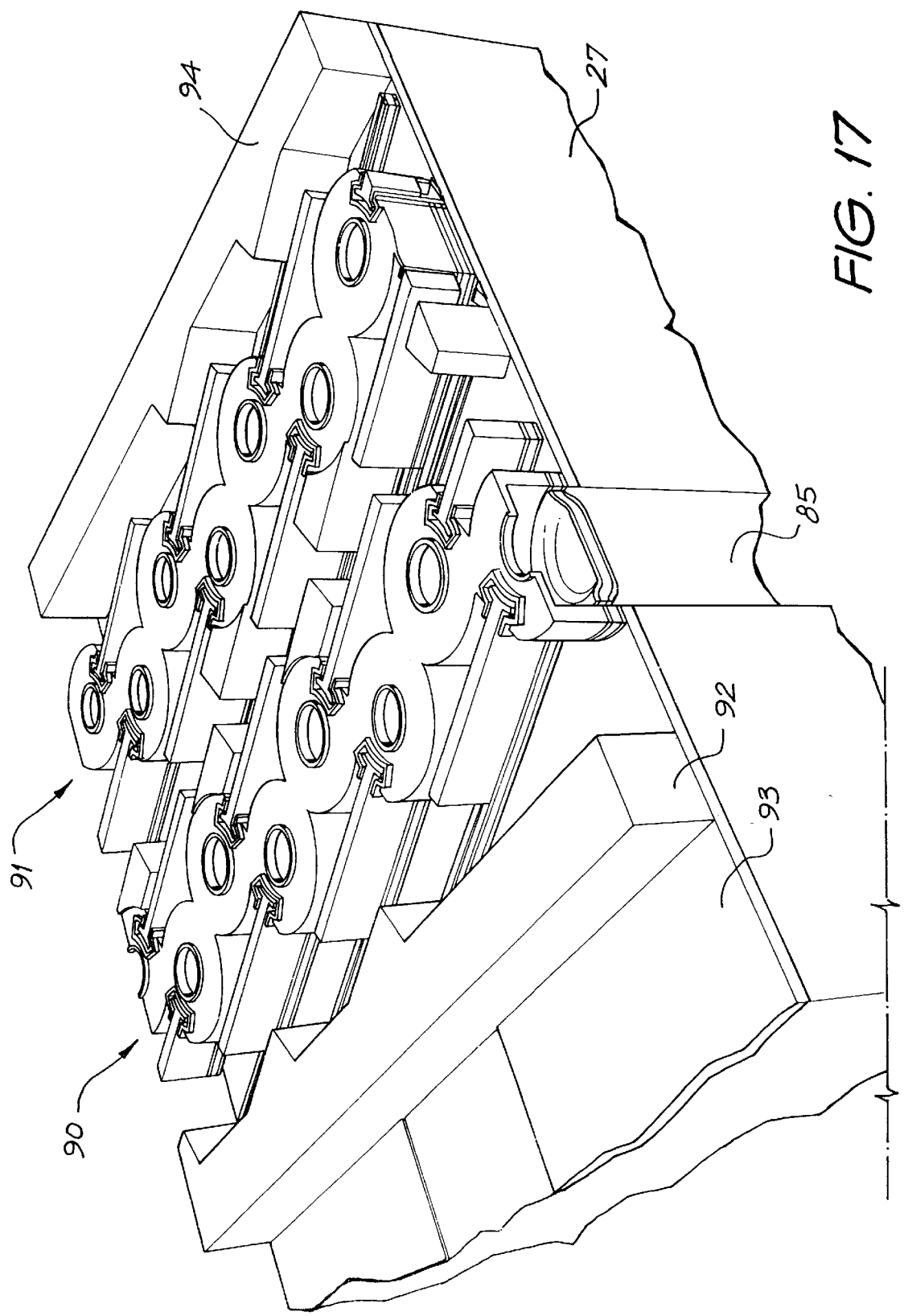
FIG. 17 illustrates a portion of a single color printhead device.

Of course, different forms of inkjet printhead structures can be formed. For example, there is illustrated in FIG. 17, a portion of a single color printhead having two spaced apart rows 90, 91, with the two rows being interleaved so as to provide for a complete line of ink to be ejected in two stages. Preferably, a guide rail 92 is provided for proper alignment of a TAB film with bond pads 93. A second protective barrier 94 can also preferably be provided. Preferably, as will become more apparent with reference to the description of FIG. 18 adjacent actuator arms are interleaved and reversed.

Figure 18:
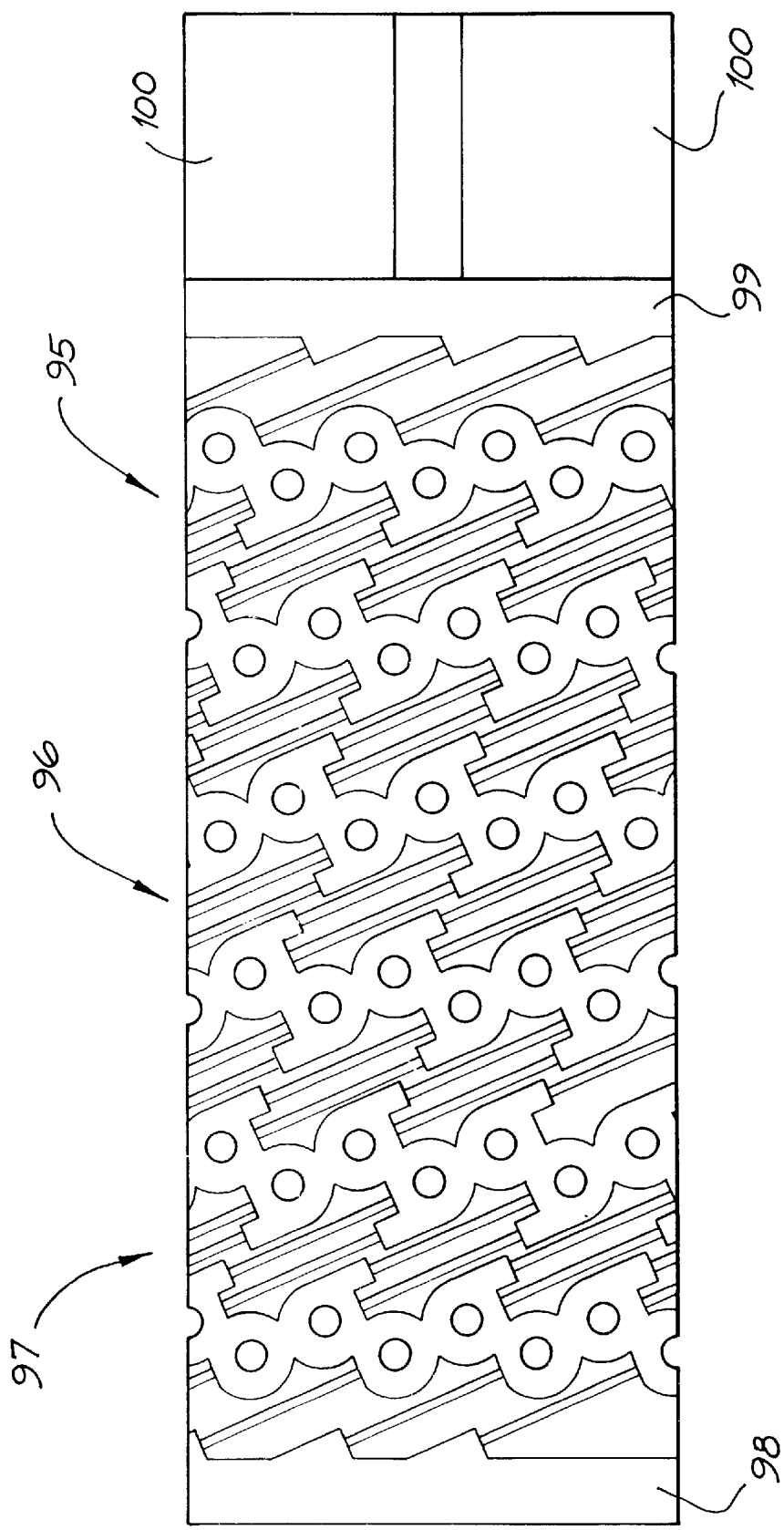
FIG. 18 illustrates a portion of a three color printhead device.

Turning now to FIG. 18, there is illustrated a full color printhead arrangement which includes three series of inkjet nozzles 95, 96, 97 one each devoted to a separate color. Again, guide rails 98, 99 are provided in addition to bond pads, eg. 100. In FIG. 18, there is illustrated a general plan of the layout of a portion of a full color printhead which clearly illustrates the interleaved nature of the actuator arms.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PhotoCD printers, portable printers for PDAs, wallpaper printers, indoor sign printers, billboard printers, fabric printers, camera printers and fault tolerant commercial printer arrays.

Figure 19:
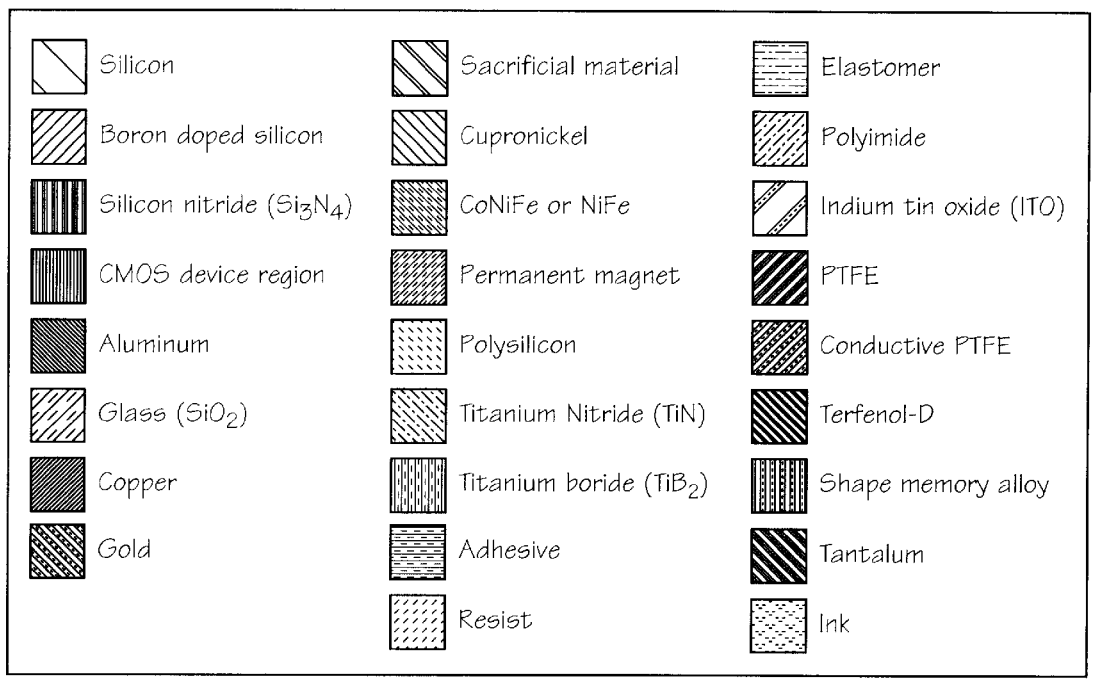
FIG. 19 provides a legend of the materials indicated in FIGS. 20 to 29.
Figure 20:
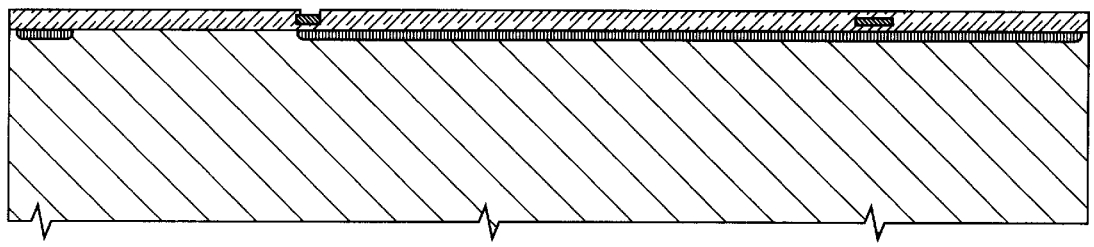
FIG. 20 to FIG. 29 illustrate sectional views of the manufacturing steps in one form of construction of an ink jet printhead nozzle.
Figure 21:
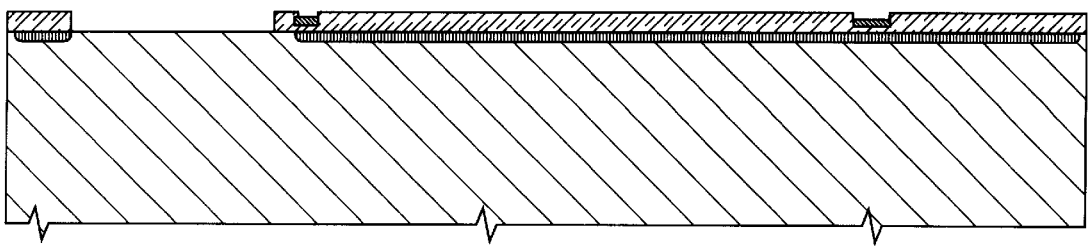
Figure 22:
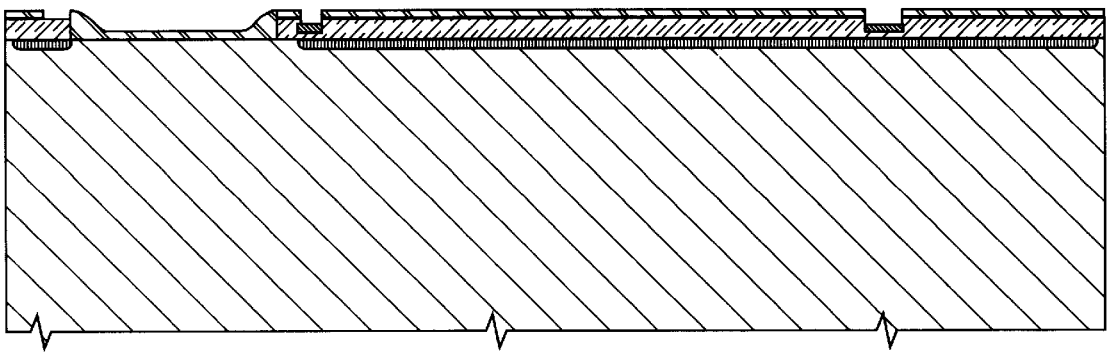
Figure 23:
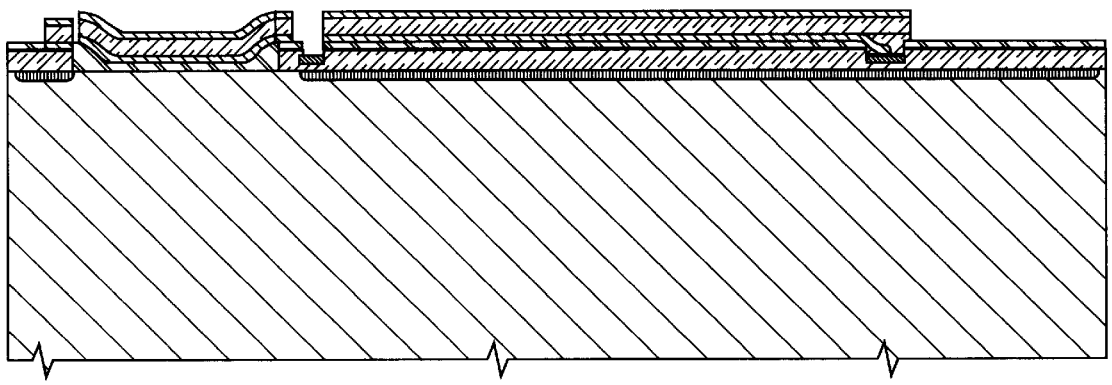

One alternative form of detailed manufacturing process which can be used to fabricate monolithic ink jet print heads operating in accordance with the principles taught by the present embodiment can proceed utilizing the following steps:

1. Using a double sided polished wafer, complete drive transistors, data distribution, and timing circuits using a 0.5 micron, one poly, 2 metal CMOS process. Relevant features of the wafer at this step are shown in FIG. 20. For clarity, these diagrams may not be to scale, and may not represent a cross section though any single plane of the nozzle. FIG. 19 is a key to representations of various materials in these manufacturing diagrams, and those of other cross referenced ink jet configurations.
2. Etch oxide down to silicon or aluminum using Mask 1. This mask defines the nozzle chamber, the surface anti-wicking notch, and the heater contacts. This step is shown in FIG. 21.
3. Deposit 1 micron of sacrificial material (e.g. aluminum or photosensitive polyimide).
4. Etch (if aluminum) or develop (if photosensitive polyimide) the sacrificial layer using Mask 2. This mask defines the nozzle chamber walls and the actuator anchor point. This step is shown in FIG. 22.
5. Deposit 1 micron of heater material (e.g. cupronickel or TiN). If cupronickel, then deposition can consist of three steps—a thin anti-corrosion layer of, for example, TiN, followed by a seed layer, followed by electroplating of the 1 micron of cupronickel.
6. Deposit 3.4 microns of PECVD glass.
7. Deposit a layer identical to step 5.
8. Etch both layers of heater material, and glass layer, using Mask 3. This mask defines the actuator, paddle, and nozzle chamber walls. This step is shown in FIG. 23.

Figure 24:
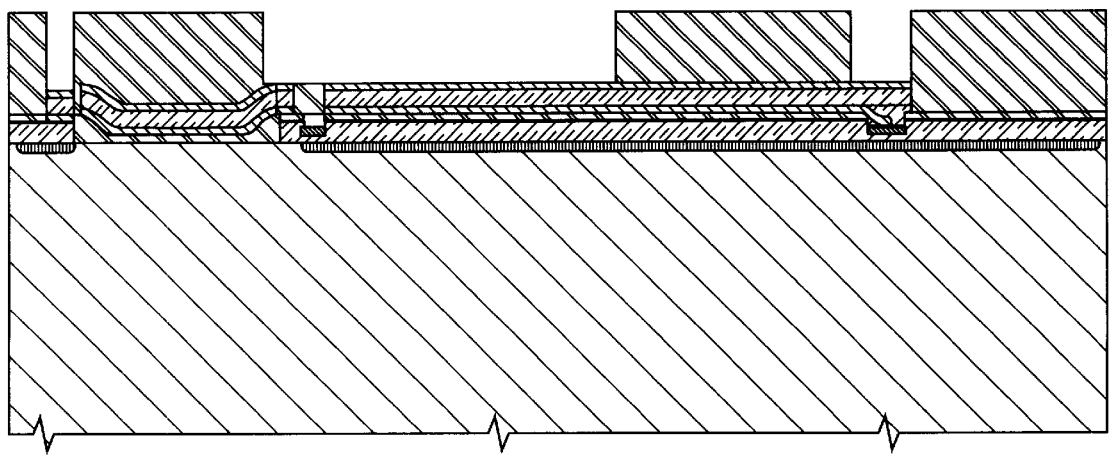
Figure 25:
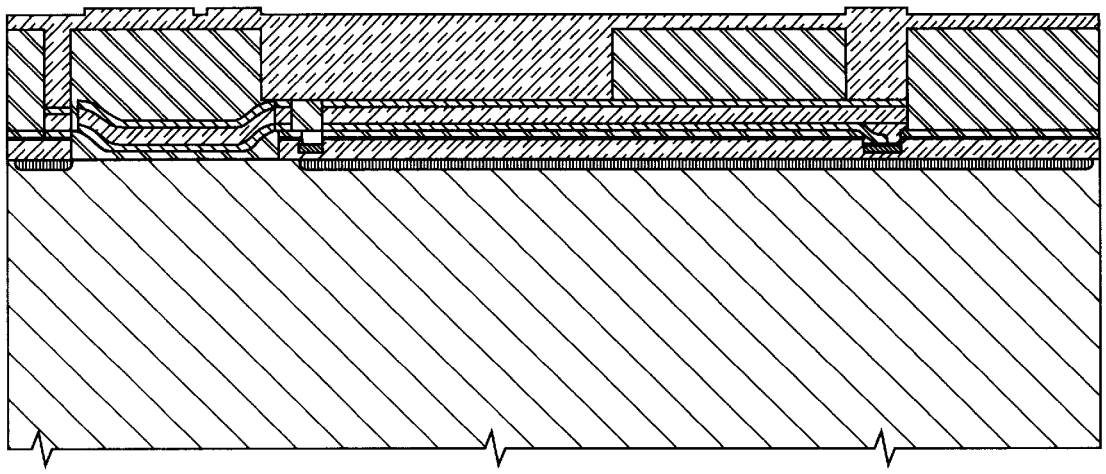
Figure 26:
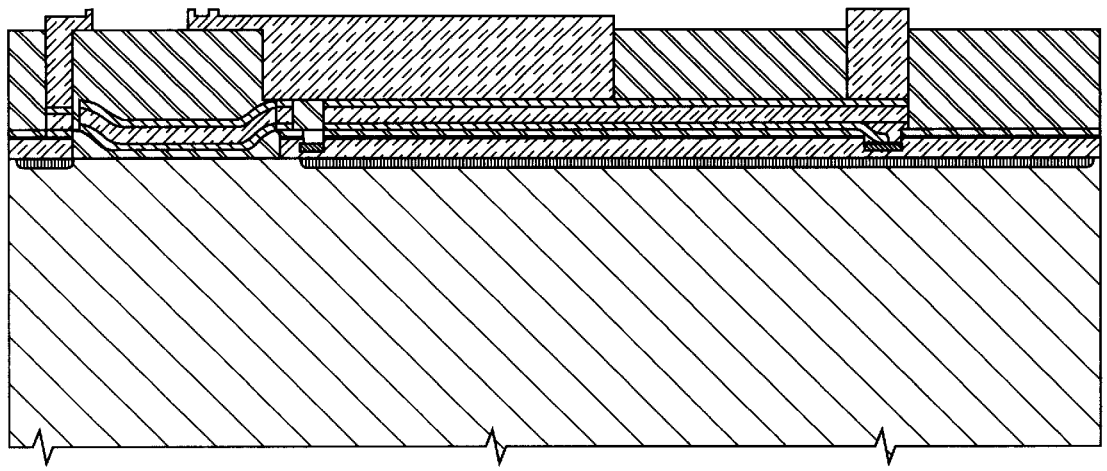
Figure 27:
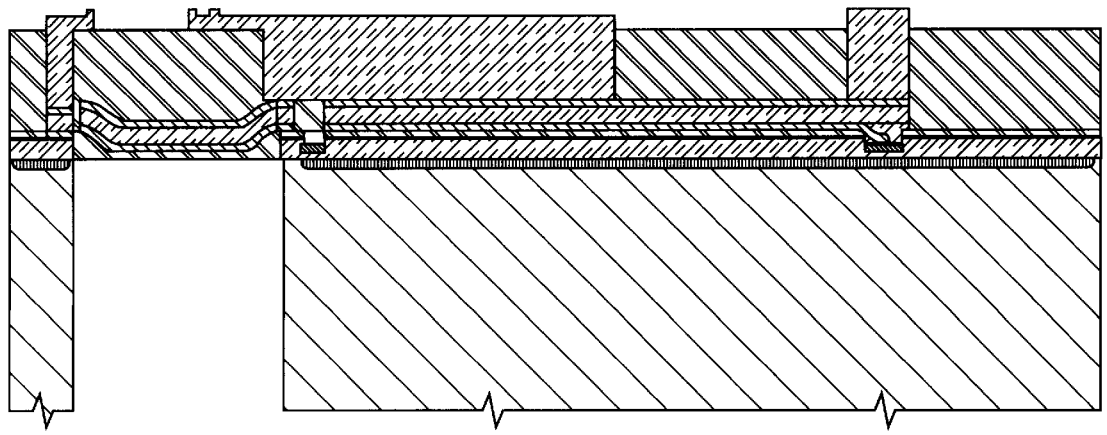
Figure 28:
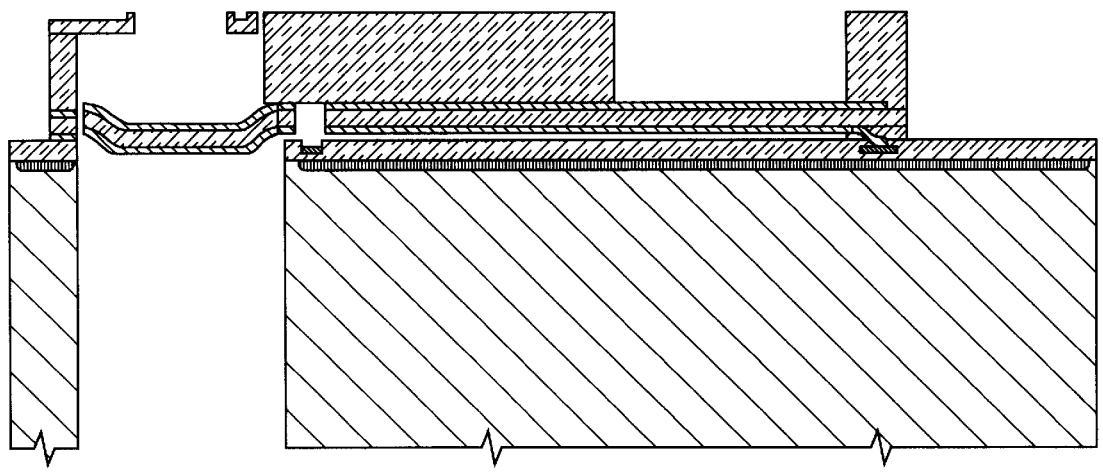
Figure 29:
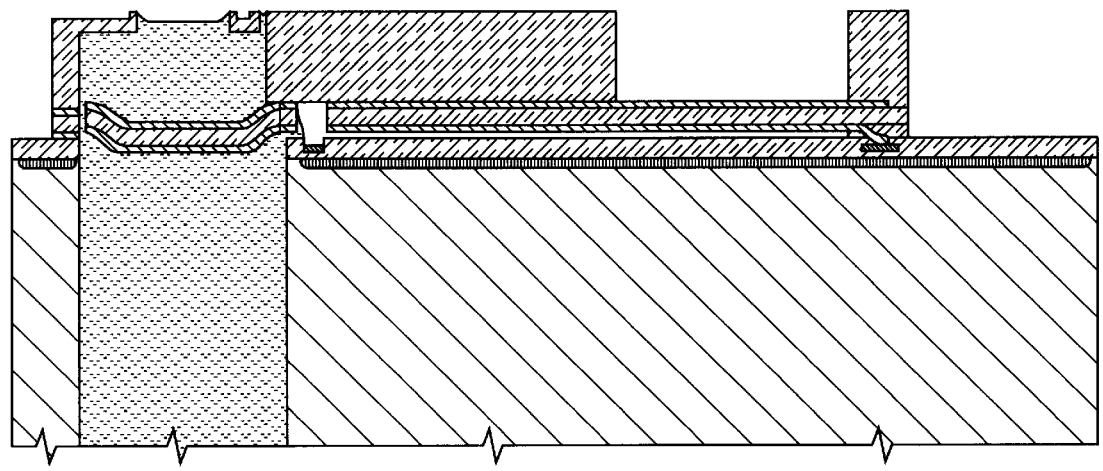

9. Wafer probe. All electrical connections are complete at this point, bond pads are accessible, and the chips are not yet separated.
10. Deposit 10 microns of sacrificial material.
11. Etch or develop sacrificial material using Mask 4. This mask defines the nozzle chamber wall. This step is shown in FIG. 24.
12. Deposit 3 microns of PECVD glass.
13. Etch to a depth of (approx.) 1 micron using Mask 5. This mask defines the nozzle rim. This step is shown in FIG. 25.
14. Etch down to the sacrificial layer using Mask 6. This mask defines the roof of the nozzle chamber, and the nozzle itself. This step is shown in FIG. 26.
15. Back-etch completely through the silicon wafer (with, for example, an ASE Advanced Silicon Etcher from Surface Technology Systems) using Mask 7. This mask defines the ink inlets which are etched through the wafer. The wafer is also diced by this etch. This step is shown in FIG. 27.
16. Etch the sacrificial material. The nozzle chambers are cleared, the actuators freed, and the chips are separated by this etch. This step is shown in FIG. 28.
17. Mount the print heads in their packaging, which may be a molded plastic former incorporating ink channels which supply the appropriate color ink to the ink inlets at the back of the wafer.
18. Connect the print heads to their interconnect systems. For a low profile connection with minimum disruption of airflow, TAB may be used. Wire bonding may also be used if the printer is to be operated with sufficient clearance to the paper.
19. Hydrophobize the front surface of the print heads.
20. Fill the completed print heads with ink and test them. A filled nozzle is shown in FIG. 29.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

Ink Jet Technologies

The embodiments of the invention use an ink jet printer type device. Of course many different devices could be used. However presently popular ink jet printing technologies are unlikely to be suitable.

The most significant problem with thermal inkjet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal inkjet applications. This leads to an efficiency of around 0.02%, from electricity input to drop momentum (and increased surface area) out.

The most significant problem with piezoelectric inkjet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the inkjet technologies used meet the stringent requirements of in-camera digital color printing and other high quality, high speed, low cost printing applications. To meet the requirements of digital photography, new inkjet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the inkjet systems described below with differing levels of difficulty. Forty-five different inkjet technologies have been developed by the Assignee to give a wide range of choices for high volume manufacture. These technologies form part of separate applications assigned to the present Assignee as set out in the table below.

The inkjet designs shown here are suitable for a wide range of digital printing systems, from battery powered one-time use digital cameras, through to desktop and network printers, and through to commercial printing systems.

For ease of manufacture using standard process equipment, the print head is designed to be a monolithic 0.5 micron CMOS chip with MEMS post processing. For color photographic applications, the print head is 100 mm long, with a width which depends upon the inkjet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

The present invention is useful in the field of digital printing, in particular, ink jet printing. A number of patent applications in this field were filed simultaneously and incorporated by cross reference.

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the in the table under the heading Cross References to Related Applications.

Other ink jet configurations can readily be derived from these 45 examples by substituting alternative configurations along one or more of the 11 axes. Most of the IJ01 to IJ45 examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

|  | Description | Advantages | Disadvantages | Examples |
| --- | --- | --- | --- | --- |
| ACTUATOR MECHANISM (APPLIED ONLY TO SELECTED INK DROPS) | | | | |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple Construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print heads are difficult to fabricate | Canon Bubblejet 1979 Endo et al GB patent 2,007,162 Xerox heater-in-pit 1990 Hawkins et al USP 4,899,181 Hewlett-Packard TIJ 1982 Vaught et al USP 4,490,728 |
| Piezo-electric | A piezoelectric crystal such as lead lanthanum zirconate (PZT) is electrically activated, and either expands, shears, or bends to apply pressure to the ink, ejecting drops. | Low power consumption Many ink types can be used Fast operation High efficiency | Very large area required for actuator Difficult to integrate with electronics High voltage drive transistors required Full pagewidth print heads impractical due to actuator size Requires electrical poling in high field strengths during manufacture | Kyser et al USP 3,946,398 Zoltan USP 3,683,212 1973 Stemme USP 3,747,120 Epson Stylus Tektronix IJ04 |
| Electro-strictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et all JP 253401/96 IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) | Low power consumption Many ink types can be used Fast operation (<1 $\mu$s) Relatively high longitudinal strain High efficiency Electric field | Difficult to integrate with electronics Unusual materials such as PLZSnT are required Actuators require a large area | IJ04 |

|   | Description | Advantages | Disadvantages | Examples |
|---|---|---|---|---|
| | exbibit large strains of up to 1% associated with the AFE to FE phase transition. | strength of around 3 V/$\mu$m can be readily provided | | |
| Electro-static plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | Low power consumption Many ink types can be used Fast operation | Difficult to operate electrostatic devices in an aqueous environment The electrostatic actuator will normally need to be separated from the ink Very large area required to achieve high forces High voltage drive transistors may be required Full pagewidth print heads are not competitive due to actuator size | IJ02, IJ04 |
| Electro-static pull on ink | A strong electric field is applied to the ink, whereupon electrostatic attraction accelerates the ink towards the print medium. | Low current consumption Low temperature | High voltage required May be damaged by sparks due to air breakdown Required field strength increases as the drop size decreases High voltage drive transistors required Electrostatic field attracts dust | 1989 Saito et al, USP 4,799,068 1989 Miura et al, USP 4,810,954 Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | Low power consumption Many ink types can be used Fast operation High efficiency Easy extension from single nozzles to pagewidth print heads | Complex fabrication Permanent magnetic material such as Neodymium Iron Boron (NdFeB) required. High local currents required Copper metalization should be used for long electromigration lifetime and low resistivity Pigmented inks are usually infeasible Operating temperature limited to the Curie temperature (around 540 K.) | IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation flux density is required 2.0–2.1 T is achievable with | IJ01, IJ05, IJ08, IJ10, IJI2, IJ14, IJ15, IJ17 |

-continued

|  | Description | Advantages | Disadvantages | Examples |
|---|---|---|---|---|
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | Low power consumption Many ink types can be used Fast operation High efficiency Easy extension from single nozzles to pagewidth print heads | CoNiFe [1]) Force acts as a twisting motion Typically, only a quarter of the solenoid length provides force in a useful direction High local currents required Copper metalization should be used for long electromigration lifetime and low resistivity Pigmented inks are usually infeasible | IJ06, IJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, USP 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | Simple Construction No unusual materials required in fabrication Easy extension from single nozzles to pagewidth print heads | Requires supplementary force to effect drop separation Requires special ink viscosity properties High speed is difficult to achieve Requires oscillating ink pressure A high temperature difference (typically 80 degrees) is required | Silverbrook, EP 0771 658 A2 and related patent applications |
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermo-elastic bend actuator | An actuator which relies upon differential thermal expansion upon Joule heating is used. | Low power consumption Many ink types can be used Simple planar fabrication Small chip area required for each actuator Fast operation | Efficient aqueous operation requires a thermal insulator on the hot side Corrosion prevention can be difficult Pigmented inks may be infeasible, as pigment particles | IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, 1J37, IJ38, 1J39, 1J40, IJ41 |

-continued

| | Description | Advantages | Disadvantages | Examples |
|---|---|---|---|---|
| | | High efficiency<br>CMOS compatible voltages and currents<br>Standard MEMS processes can be used<br>Easy extension from single nozzles to pagewidth print heads | may jam the bend actuator | |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include:<br>Bend<br>Push<br>Buckle<br>Rotate | High force can be generated<br>Three methods of PTFE deposition are under development: chemical vapor deposition (CVD), spin coating, and evaporation<br>PTFE is a candidate for low dielectric constant insulation in ULSI<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special material (e.g. PTFE)<br>Requires a PTFE deposition process, which is not yet standard in ULSI fabs<br>PTFE deposition cannot be followed with high temperature (above 350° C.) processing<br>Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, 1342, IJ43, IJ44 |
| Conductive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated.<br>Examples of conducting dopants include:<br>Carbon nanotubes<br>Metal fibers<br>Conductive polymers such as doped polythiophene<br>Carbon granules | High force can be generated<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special materials development (High CTE conductive polymer)<br>Requires a PTFE deposition process, which is not yet standard in ULSI fabs<br>PTFE deposition cannot be followed with high temperature (above 350° C.) processing<br>Evaporation and CVD deposition techniques cannot be used<br>Pigmented inks may be infeasible, as pigment particles may jam the bend actuator | IJ24 |
| Shape memory alloy | A shape memory alloy such as TiNi (also known as Nitinol - Nickel Titanium alloy developed at the Naval Ordnance Laboratory) is thermally switched between its weak martensitic state and its high stiffness austenic state. The | High force is available (stresses of hundreds of MPa)<br>Large strain is available (more than 3%)<br>High corrosion resistance<br>Simple construction<br>Easy extension from single nozzles to | Fatigue limits maximum number of cycles<br>Low strain (1%) is required to extend fatigue resistance<br>Cycle rate limited by heat removal<br>Requires unusual materials (TiNi)<br>The latent heat of | IJ26 |

|  | Description | Advantages | Disadvantages | Examples |
|---|---|---|---|---|
|  | shape of the actuator in its martensitic state is deformed relative to the austenic shape. The shape change causes ejection of a drop. | pagewidth print heads Low voltage operation | transformation must be provided High current operation Requires pre-stressing to distort the martensitic state |  |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear Magnetic actuators can be constructed with high thrust, long travel, and high efficiency using planar semiconductor fabrication techniques Long actuator travel is available Medium force is available Low voltage operation | Requires unusual semiconductor materials such as soft magnetic alloys (e.g. CoNiFe) Some varieties also require permanent magnetic materials such as Neodymium iron boron (NdFeB) Requires complex multi-phase drive circuitry High current operation | IJ12 |

BASIC OPERATION MODE

|  | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repetition rate is usually limited to around 10 kHz. However, this is not fundamental to the method, but is related to the refill method normally used All of the drop kinetic energy must be provided by the actuator Satellite drops usually form if drop velocity is greater than 4.5 m/s | Thermal ink jet Piezoelectric ink jet IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used The drop selection means does not need to provide the energy required to separate the drop from the nozzle | Requires close proximity between the print head and the print media or transfer roller May require two print heads printing alternate rows of the image Monolithic color print heads are difficult | Silverbrook, EP 0771 658 A2 and related patent applications |
| Electro-static pull on ink | The drops to be printed are selected by some manner (e.g. thermally induced surface tension reduction of pressurized ink). Selected drops are separated from the ink in the nozzle by a strong electric field. | Very simple print head fabrication can be used The drop selection means does not need to provide the energy required to separate the drop from the nozzle | Requires very high electrostatic field Electrostatic field for small nozzle sizes is above air breakdown Electrostatic field may attract dust | Silverbrook, EP 077 1658 A2 and related patent applications Tone-Jet |
| Magnetic pull on ink | The drops to be printed are selected by some manner (e.g. thermally induced surface tension reduction of pressurized ink). Selected drops are separated from the ink in the nozzle by a strong magnetic field | Very simple print head fabrication can be used The drop selection means does not need to provide the energy required to separate the drop from the nozzle | Requires magnetic ink Ink colors other than black are difficult Requires very high magnetic fields | Silverbrook, EP 0771 658 A2 and related patent applications |

-continued

|   | Description | Advantages | Disadvantages | Examples |
|---|---|---|---|---|
|   | acting on the magnetic ink. |   |   |   |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | IJ13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 kHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |
| AUXILIARY MECHANISM (APPLIED TO ALL NOZZLES) | | | | |
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | Oscillating ink pressure can provide a refill pulse, allowing higher operating speed The actuators may operate with much lower energy Acoustic lenses can be used to focus the sound on the nozzles | Requires external ink pressure oscillator Ink pressure phase and amplitude must be carefully controlled Acoustic reflections in the ink chamber must be designed for | Silverbrook, EP 0771 658 A2 and related patent applications IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop soaks into the medium fast enough to cause drop separation. | Low power High accuracy Simple print head construction | Precision assembly required Paper fibers may cause problems Cannot print on rough substrates | Silverbrook, EP 0771 658 A2 and related patent applications |
| Transfer roller | Drops are printed to a transfer roller instead of straight to the print medium. A transfer | High accuracy Wide range of print substrates can be used | Bulky Expensive Complex construction | Silverbrook, EP 0771 658 A2 and related patent applications |

-continued

| | Description | Advantages | Disadvantages | Examples |
|---|---|---|---|---|
| | roller can also be used for proximity drop separation. | Ink can be dried on the transfer roller | | Tektronix hot melt piezoelectric ink jet Any of the IJ series |
| Electro-static | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |
| ACTUATOR AMPLIFICATION OR MODIFICATION METHOD ||||| 
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble Ink jet IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | Provides greater travel in a reduced print head area | High stresses are involved Care must be taken that the materials do not delaminate Residual bend resulting from high temperature or high stress during formation | Piezoelectric IJ03, IJ09, 1J17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | Very good temperature stability High speed, as a new drop can be fired before heat dissipates Cancels residual stress of formation | High stresses are involved Care must be taken that the materials do not delaminate | IJ40, IJ41 |
| Reverse spring | The actuator loads W spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Actuator stack | A series of thin actuators are stacked. This can be appropriate where | Increased travel Reduced drive voltage | Increased fabrication complexity Increased possibility | Some piezoelectric ink jets IJ04 |

-continued

|  | Description | Advantages | Disadvantages | Examples |
|---|---|---|---|---|
|  | actuators require high electric field strength, such as electrostatic and piezoelectric actuators. |  | of short circuits due to pinholes |  |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip | Simple means of increasing travel of a bend actuator | Care must be taken not to exceed the elastic limit in the flexure area Stress distribution is very uneven Difficult to accurately model with finite element analysis | IJ10, IJ19, IJ33 |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418–423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |

-continued

|  | Description | Advantages | Disadvantages | Examples |
| --- | --- | --- | --- | --- |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550, 192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| Volume expansion | The volume of the actuator changes, pushing the ink in all directions. | Simple construction in the case of thermal ink jet | High energy is typically required to achieve volume expansion. This leads to thermal stress, cavitation, and kogation in thermal ink jet implementations | Hewlett-Packard Thermal Ink jet Canon Bubblejet |
| --- | --- | --- | --- | --- |
| Linear, normal to chip surface | The actuator moves in a direction normal to the print head surface. The nozzle is typically in the line of movement. | Efficient coupling to ink drops ejected normal to the surface | High fabrication complexity may be required to achieve perpendicular motion | IJ01, IJ02, IJ04, IJ07, IJ11, IJ14 |
| Parallel to chip surface | The actuator moves parallel to the print head surface. Drop ejection may still be normal to the surface. | Suitable for planar fabrication | Fabrication complexity Friction Stiction | IJ12, IJ13, IJ15, IJ33, IJ34, IJ35, IJ36 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins USP 4,459,601 |
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezoelectric expansion, magnetostriction, or other form of relative dimensional change. | A very small change in dimensions can be converted to a large motion. | Requires the actuator to be made from at least two distinct layers, or to have a thermal difference across the actuator | 1970 Kyser et aJ USP 3,946,398 1973 Stemme USP 3,747,120 IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is | Requires careful balance of stresses to ensure that the quiescent bend is | IJ26, IJ32 |

-continued

|   | Description | Advantages | Disadvantages | Examples |
|---|---|---|---|---|
| Double bend | The actuator bends in one direction when one element is energized, and bends the other way when another element is energized. | planar One actuator can be used to power two nozzles. Reduced chip size. Not sensitive to ambient temperature | accurate Difficult to make the drops ejected by both bend directions identical A small efficiency loss compared to equivalent single bend actuators. | IJ36, IJ37, IJ38 |
| Shear | Energizing the actuator causes a shear motion in the actuator material. | Can increase the effective travel of piezoelectric actuators | Not readily applicable to other actuator mechanisms | 1985 Fishbeck USP 4,584, 590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan USP 3,683,212 |
| Coil/ uncoil | A coiled actuator uncoils or coils more tightly. The motion of the free end of the actuator ejects the ink. | Easy to fabricate as a planar VLSI process Small area required, therefore low cost | Difficult to fabricate for non-planar devices Poor out-of-plane stiffness | IJ17, IJ21, IJ34, IJ35 |
| Bow | The actuator bows (or buckles) in the middle when energized. | Can increase the speed of travel Mechanically rigid | Maximum travel is constrained High force required | IJ16, IJ18, IJ27 |
| Push-Pull | Two actuators control a shutter. One actuator pulls the shutter, and the other pushes it. | The structure is pinned at both ends, so has a high out-of-plane rigidity | Not readily suitable for ink jets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chambered surrounding the actuators, and expelling ink from a nozzle in the chamber. | Relatively simple construction | Relatively large chip area | IJ43 |
| Iris | Multiple vanes enclose a volume of ink. These simultaneously rotate, reducing the volume between the vanes. | High efficiency Small chip area | High fabrication complexity Not suitable for pigmented inks | IJ22 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550, 192 1993 Elrod et al, EUP 572,220 |
| None | In various ink jet designs the actuator does not move. | No moving parts | Various other tradeoffs are required to eliminate moving parts | Silverbrook, EP 0771 658 A2 and related patent application Tone-jet |
| NOZZLE REFILL METHOD ||||
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring | Fabrication simplicity Operational simplicity | Low speed Surface tension force relatively small compared to actuator force Long refill time usually dominates the total repetition rate | Thermal ink jet Piezoelectric ink jet IJ01–IJ07, IJ10–IJ14, IJ16, IJ20, IJ22–IJ45 |

| | Description | Advantages | Disadvantages | Examples |
|---|---|---|---|---|
| | the meniscus to a minimum area. This force refills the nozzle. | | | |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | High speed Low actuator energy, as the actuator need only open or close the shutter, instead of ejecting the ink drop | Requires common ink pressure oscillator May not be suitable for pigmented inks | IJ08, IJ13, IJ15, IJ17, IJ18, IJ19, IJ21 |
| Refill actuator | After the main actuator has ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | IJ09 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented Highly hydrophobic print head surfaces are required | Silverbrook, EP 0771 658 A2 and related patent applications Alternative for:, IJ01–IJ07, IJ10–IJ14, IJ16, IJ20, IJ22–IJ45 |
| METHOD OF RESTRICTING BACK-FLOW THROUGH INLET | | | | |
| Long inlet channel | The ink knlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01–IJ07, IJ09–IJ12, IJ14, IJ16, IJ20, IJ22, IJ23–IJ34, IJ36–IJ41, IJ44 |
| Baffle | One or more baffles are placed in the inlet ink flow. Then the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |

|  | Description | Advantages | Disadvantages | Examples |
| --- | --- | --- | --- | --- |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27, IJ29, IJ30 |
| Small inlet compared to nozzle | The ink inlet channel to the nozzle chamber has a substantially smaller cross section than that of the nozzle, resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

NOZZLE CLEARING METHOD

|  | Description | Advantages | Disadvantages | Examples |
| --- | --- | --- | --- | --- |
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | No added complexity on the print head | May no be sufficient to displace dried ink | Most ink jet systems IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink heater | In systems which heat the ink, but do not boil it under normal situations, nozzle | Can be highly effective if the heater is adjacent to the nozzle | Requires higher drive voltage for clearing May require larger | Silverbrook, EP 0771 658 A2 and related patent applications |

-continued

|  | Description | Advantages | Disadvantages | Examples |
| --- | --- | --- | --- | --- |
|  | clearing can be achieved by over-powering the heater and boiling ink at the nozzle. |  | drive transistors |  |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the ink jet nozzle | May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damages to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all IJ series ink jets |
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume print systems | Many ink jet systems |
| Separate ink boiling heater | A separate heater is provided at the nozzle although the normal drop e-ection mechanism does not require it. The heaters do not require individual drive circuits, as many | Can be effective where other nozzle clearing methods cannot be used Can be implemented at no additional cost in some ink jet configurations | Fabrication complexity | Can be used with many IJ series ink |

|  | Description | Advantages | Disadvantages | Examples |
| --- | --- | --- | --- | --- |
|  | nozzles can be cleared simultaneously, and no imaging is required. | | | |
| | | NOZZLE PLATE CONSTRUCTION | | |
| Electroformed nickel | A nozzle palte is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Ink jet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol, 998 Excimer Beam Applications, pp. 76–83 1993 Watanabe et at., USP 5,208,604 |
| Silicon micromachined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vol. ED-25, No. 10, 1978, pp 1185–1195 Xerox 1990 Hawkins et al., USP 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan USP 3,683,212 |
| Monolithic, surface micromachined using VLSI lithographic processes | The nozzle plate is deposited as a layer using standard VLSI deposition techniques. Nozzles are etched in the nozzle plate using VLSI lithography and etching. | High accuracy (<1 $\mu$m) Monolithic Low cost Existing processes can be used | Requires sacrificial layer under the nozzle plate to form the nozzle chamber Surface may be fragile to the touch | Silverbrook, EP 0771 658 A2 and related patent applications IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44, |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 $\mu$m) Monolithic Low cost No differential expansion | Requires long etch times Requires a support wafer | IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al USP 5,412,413 1993 Hadimioglu et al EUP 550,192 1993 Elrod et al EUP 572,220 |
| Trough | Each drop ejector has a trough through which a paddle moves. There is no nozzle | Reduced manufacturing complexity Monolithic | Drop firing direction is sensitive to wicking. | IJ35 |

-continued

|  | Description | Advantages | Disadvantages | Examples |
| --- | --- | --- | --- | --- |
| Nozzle slit instead of individual nozzles | plate. The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al USP 4,799,068 |

DROP EJECTION DIRECTION

|  | Description | Advantages | Disadvantages | Examples |
| --- | --- | --- | --- | --- |
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al USP 4,899,181 Tone-jet |
| Surface ('roof shooter' | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al USP 4,490,728 IJ02, IJ11, IJ12, IJ20, IJ22 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications IJ04, IJ17, IJ18, IJ24, IJ27–IJ45 |
| Through chip, reverse ('down shooter') | Ink flow is through the chip, and ink drops are ejected from the rear surface of the chip. | High ink flow Suitable for pagewidth print heads High nozzle packing density therefore low manufacturing cost | Requires wafer thinning Requires special handling during manufacture | IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | Suitable for piezoelectric print heads | Pagewidth print heads require several thousand connections to drive circuits Cannot be manufactured in standard CMOS fabs Complex assembly required | Epson Stylus Tektronix hot melt piezoelectric ink jets |

INK TYPE

|  | Description | Advantages | Disadvantages | Examples |
| --- | --- | --- | --- | --- |
| Aqueous, dye | Water based ink which typically contains: water, dye, surfactant, humectant, and biocide. Modern ink dyes have high water-fastness, ligh fastness | Environmentally friendly No odor | Slow drying Corrosive Bleeds on paper May strikethrough Cockles paper | Most existing ink jets All IJ series ink jets Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | IJ02, IJ04, IJ21, IJ26, IJ27, IJ30 Silverbrook, EP 0771 658 A2 and related patent applications Piezoelectric ink-jets Thermal ink jets (with significant restrictions) |
| Methyl Ethyl Ketone | MEK is a highly volatile solvent used for industrial printing | Very fast drying Prints on various substrates such as | Odorous Flammable | All IJ series ink jets |

-continued

| | Description | Advantages | Disadvantages | Examples |
|---|---|---|---|---|
| (MEK) | on difficult surfaces such as aluminum cans. | metals and plastics | | |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Sligh odor Flammable | All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | No drying time- ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power Long warm-up time | Tektronix hot melt piezoelectric ink jets 1989 Nowak USP 4,820,346 All IJ series ink jets |
| Oil | Oil based inks are extensively used in offset printing. They have advantages in improved characteristics on paper (especially no wicking or cockle). Oil soluble dies and pigments are required. | High solubility medium for some dyes Does not cockle paper Does no wick through paper Slow drying | High viscosity: this is a significant limitation for use in ink jets, which usually require a low viscosity. Some short chain and multi-branched oils have a sufficiently low viscosity. | All IJ series ink jets |
| Micro-emulsion | A microemulsion is a stable, self forming emulsion of oil, water, and surfactant. The characteristic drop size is less than 100 nm, and is determined by the preferred curvature of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All IJ series ink jets |

What is claimed is:

1. A method of manufacture of an inkjet printhead which includes:
   providing a substrate;
   depositing a doped layer on the substrate and etching said layer to create an array of nozzles on the substrate with a nozzle chamber in communication with each nozzle; and
   utilizing planar monolithic deposition, lithographic and etching processes to create a paddle arranged in each nozzle chamber, each paddle being connected to a thermal bend actuator unit and the thermal bend actuator unit comprising a tapered thermal bend device.

2. A method of manufacturing an inkjet printhead as claimed in claim 1 wherein multiple inkjet printheads are formed simultaneously on the substrate.

3. A method of manufacturing an ink jet printhead as claimed in claim 1 wherein said substrate is a silicon wafer.

4. A method of manufacturing an inkjet printhead as claimed in claim 1 wherein integrated drive electronics are formed on the same substrate.

5. A method of manufacturing an ink jet printhead as claimed in claim 4 wherein said integrated drive electronics are formed using a CMOS fabrication process.

6. A method of manufacturing an inkjet printhead as claimed in claim 1 wherein ink is ejected from said substrate normal to said substrate.

7. A method of manufacture of an ink jet printing nozzle arrangement on a wafer, said arrangement including:
   an ink chamber having an ink ejection nozzle in one wall thereof for the ejection of ink from said ink chamber;
   a moveable paddle vane located within said ink chamber, said paddle vane including a concave surface in the area adjacent said ink ejection nozzle; and
   an actuator means adapted to move said paddle vane so as to cause ink within said ink chamber to be ejected from said ink ejection nozzle;
   said method comprising the steps of:
   (a) starting with a silicon wafer layer having requisite circuitry deposited thereon;
   (b) depositing and etching a first sacrificial layer to form a cavity for said paddle vane and a portion of said nozzle chamber;
   (c) depositing and etching a series of layers simultaneously forming the operational portions of said actuator means and said paddle vane;
   (d) depositing a second sacrificial layer forming a cavity for said ink chamber walls and remaining portions (if any) of said actuator;

(e) depositing said chamber walls and remaining portions of said actuator;

(f) forming a nozzle chamber roof including an ink ejection nozzle; and (g) etching said sacrificial layers away.

8. A method as claimed in claim 7 wherein the step (c) includes utilizing a single mask to etch said layers.

9. A method as claimed in claim 7 wherein said step (c) includes depositing two layers of substantially the same thermal properties, one of said layers including the an operational portion of said actuator, such that, upon cooling of said layers, said two layers are in a state of thermal tension between one other.

10. A method as claimed in claim 7 wherein said wafer comprises a double side polished CMOS wafer.

11. A method as claimed in claim 7 wherein step (g) is also utilized to simultaneously separate said wafer into separate printheads.

* * * * *